US011323646B2

(12) United States Patent
Ito

(10) Patent No.: US 11,323,646 B2
(45) Date of Patent: May 3, 2022

(54) IMAGING DEVICE

(71) Applicant: SONY SEMICONDUCTOR SOLUTIONS CORPORATION, Atsugi (JP)

(72) Inventor: Keita Ito, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/250,375

(22) PCT Filed: Jun. 26, 2019

(86) PCT No.: PCT/JP2019/025361
§ 371 (c)(1),
(2) Date: Jan. 13, 2021

(87) PCT Pub. No.: WO2020/021945
PCT Pub. Date: Jan. 30, 2020

(65) Prior Publication Data
US 2021/0289158 A1 Sep. 16, 2021

(30) Foreign Application Priority Data
Jul. 24, 2018 (JP) .............................. JP2018-138176

(51) Int. Cl.
*H04N 5/378* (2011.01)
*H01L 27/146* (2006.01)
(Continued)

(52) U.S. Cl.
CPC .................. *H04N 5/37455* (2013.01); *H01L 27/14634* (2013.01); *H04N 5/3698* (2013.01)

(58) Field of Classification Search
CPC ............... H04N 5/3598; H04N 5/3698; H04N 5/37455; H04N 5/378; H01L 27/14612; H01L 27/14634
See application file for complete search history.

(56) References Cited

U.S. PATENT DOCUMENTS 7,304,674 B2 * 12/2007 Mentzer ................. H04N 5/335
250/208.1
10,873,715 B2 * 12/2020 Hanzawa ............... H04N 5/347
(Continued)

FOREIGN PATENT DOCUMENTS

JP  2008-060872 A  3/2008
JP  2011-176762 A  9/2011
(Continued)

OTHER PUBLICATIONS

International Search Report and Written Opinion of PCT Application No. PCT/JP2019/025361, dated Sep. 10, 2019, 06 pages of ISRWO.

*Primary Examiner* — Lin Ye
*Assistant Examiner* — Chriss S Yoder, III
(74) *Attorney, Agent, or Firm* — Chip Law Group

(57) ABSTRACT

An imaging device according to the present disclosure includes: an imaging unit; a connector; and a converter. The imaging unit includes a first signal line, a first pixel, a second signal line, and a second pixel. The first pixel is configured to output a first pixel voltage to the first signal line. The first pixel voltage corresponds to an amount of received light. The second pixel is configured to output a second pixel voltage to the second signal line. The second pixel voltage corresponds to the amount of received light. The connector includes a connection line, a first connection switch, a first control circuit, a second connection switch, and a second control circuit. The first connection switch is configured to couple the first signal line to the connection line by being (Continued)

turned on. The first control circuit is configured to control an operation of the first connection switch on the basis of a voltage in the first signal line. The second connection switch is configured to couple the second signal line to the connection line by being turned on. The second control circuit is configured to control an operation of the second connection switch on the basis of a voltage in the second signal line. The converter is coupled to the first signal line and the second signal line. The converter is configured to perform AD conversion on the basis of each of the first pixel voltage and the second pixel voltage.

8 Claims, 22 Drawing Sheets

(51) Int. Cl.
*H04N 5/3745* (2011.01)
*H04N 5/369* (2011.01)

(56) References Cited

U.S. PATENT DOCUMENTS

| | | | |
|---|---|---|---|
| 11,025,846 B2* | 6/2021 | Kawazu | H04N 5/3698 |
| 2008/0055432 A1 | 3/2008 | Koseki | |
| 2017/0064233 A1* | 3/2017 | Matsumoto | H01L 27/14645 |

FOREIGN PATENT DOCUMENTS

| | | |
|---|---|---|
| WO | 2011/104781 A1 | 9/2011 |
| WO | 2012/144218 A1 | 10/2012 |
| WO | 2014/132822 A1 | 9/2014 |

* cited by examiner

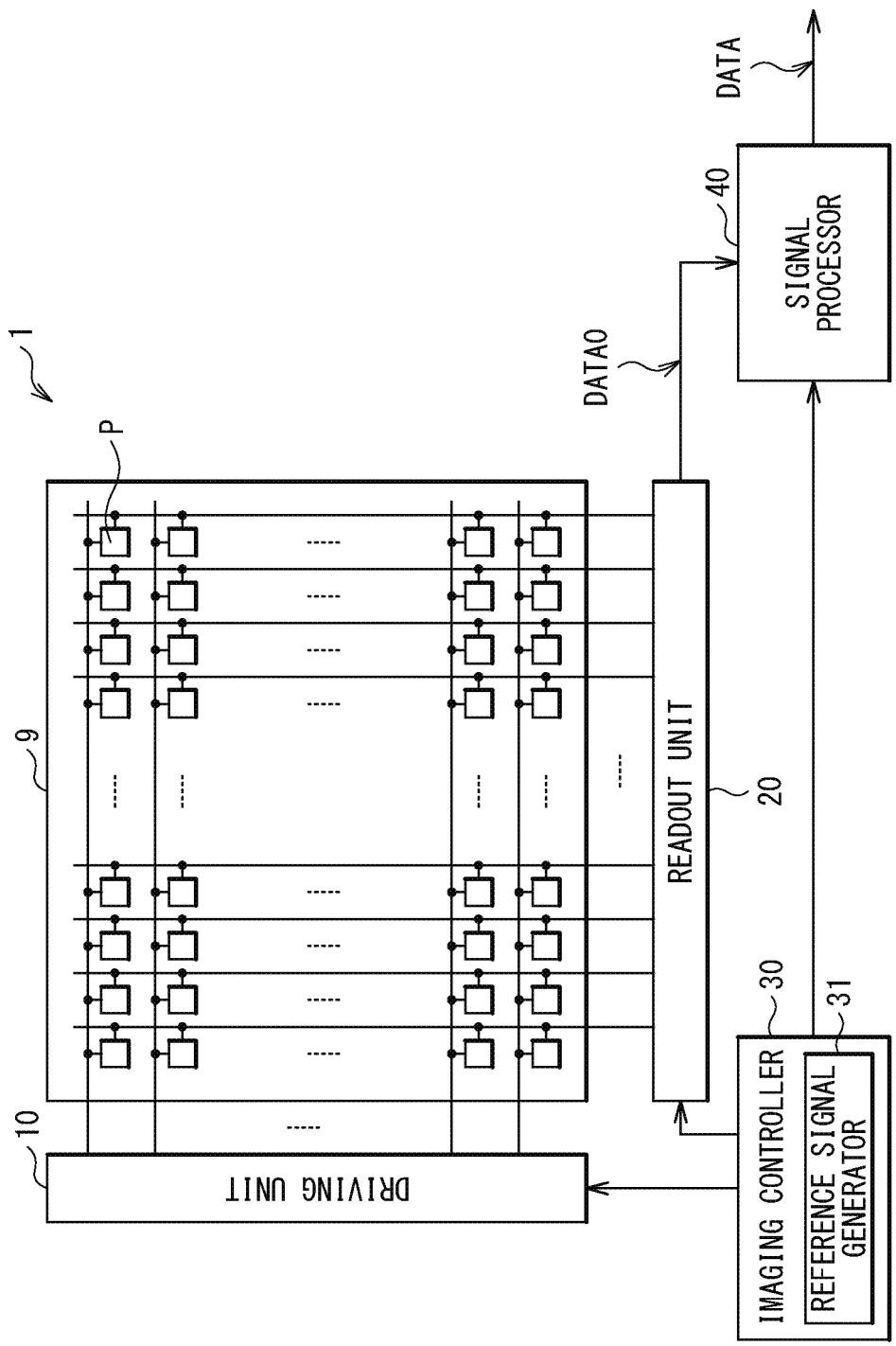
[FIG. 1]

[FIG. 2]
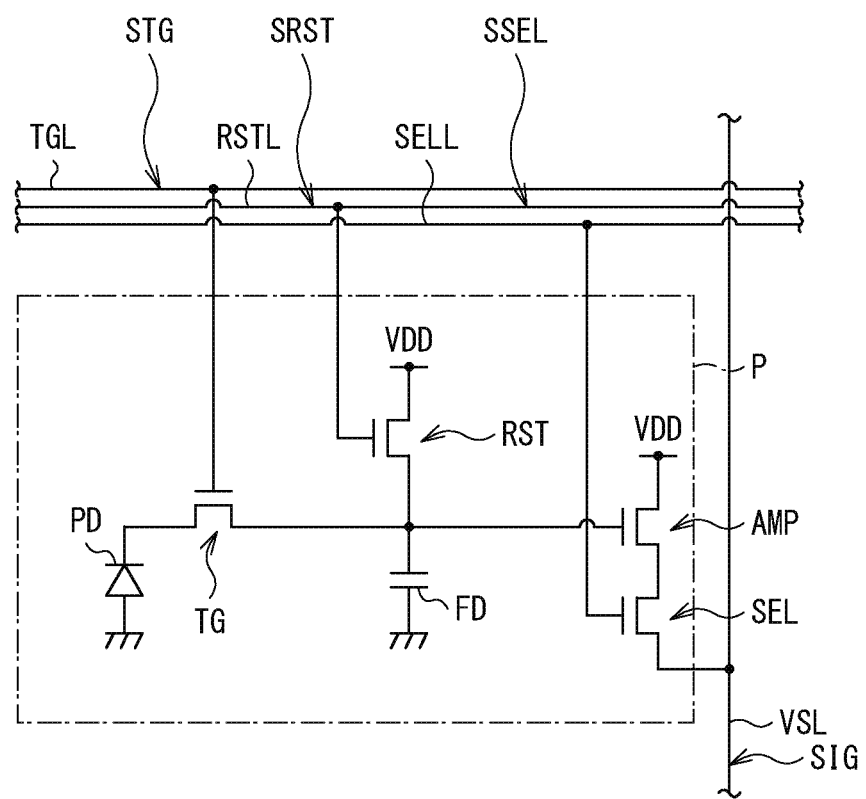

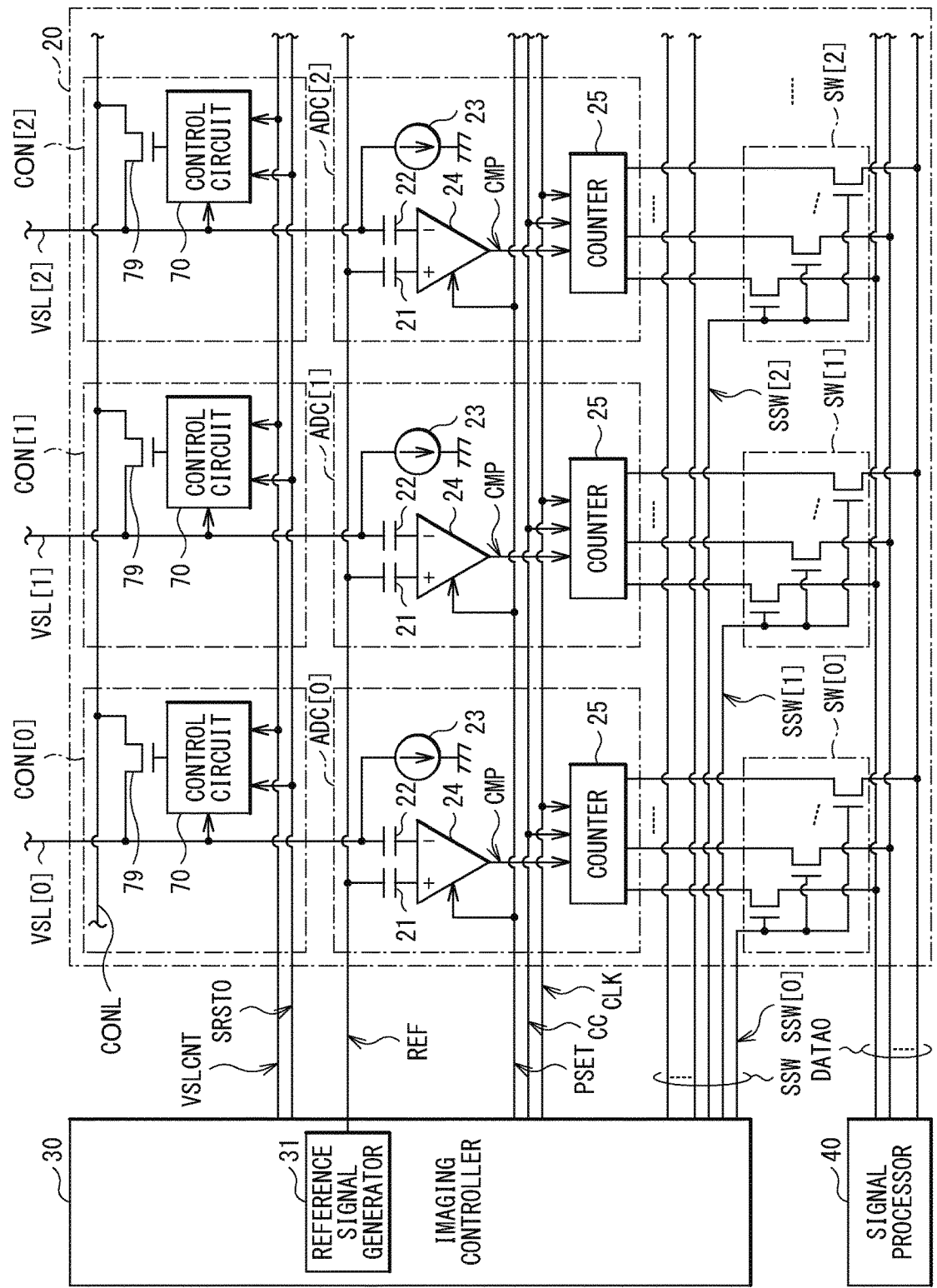

[FIG. 4]
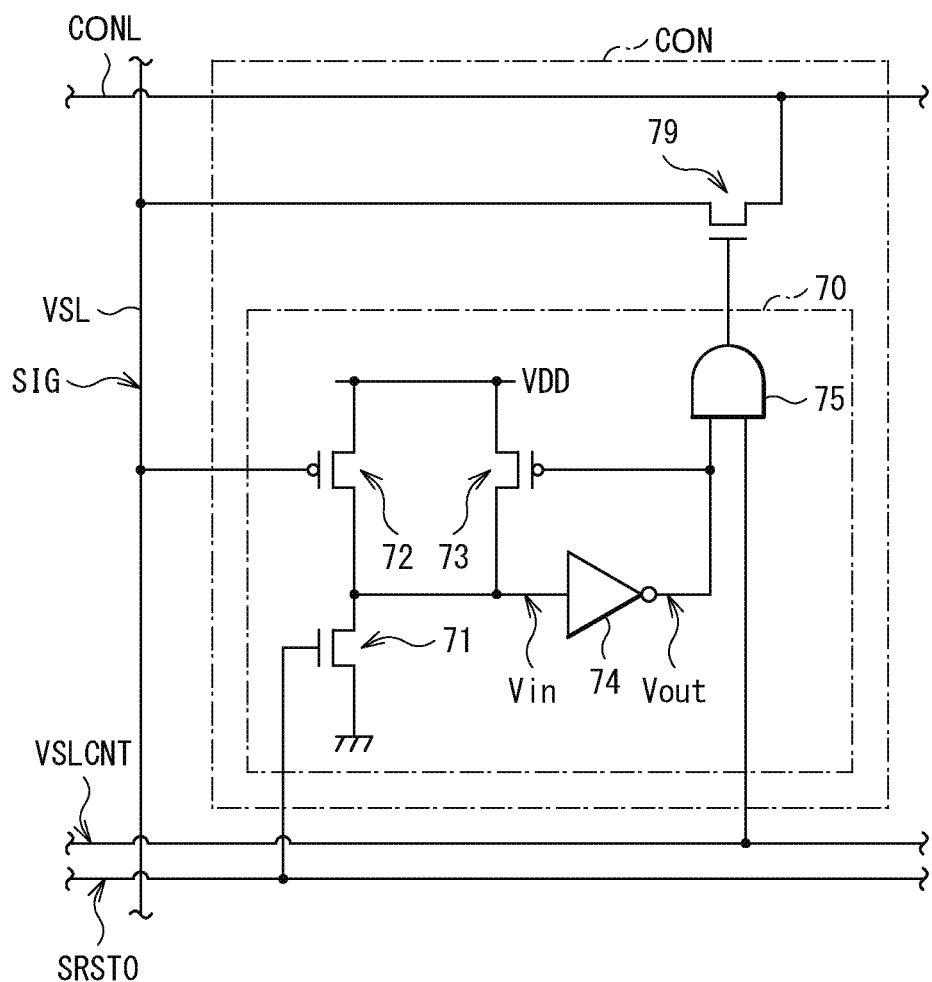

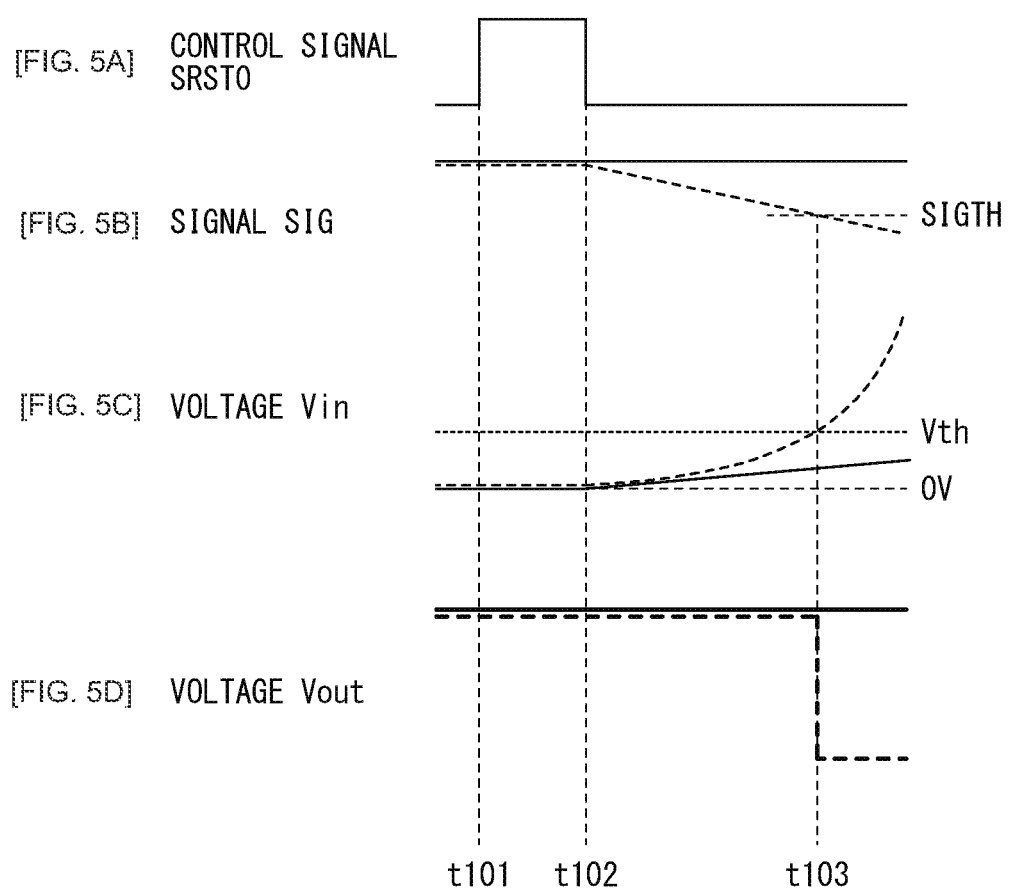

[FIG. 6A]
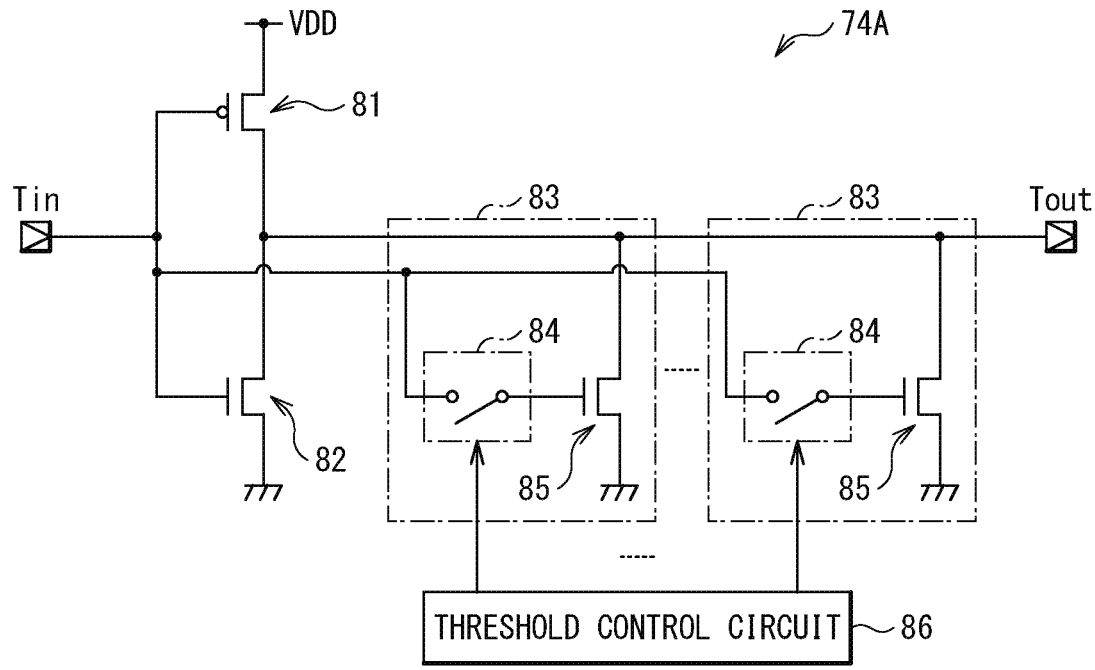
[FIG. 6B]
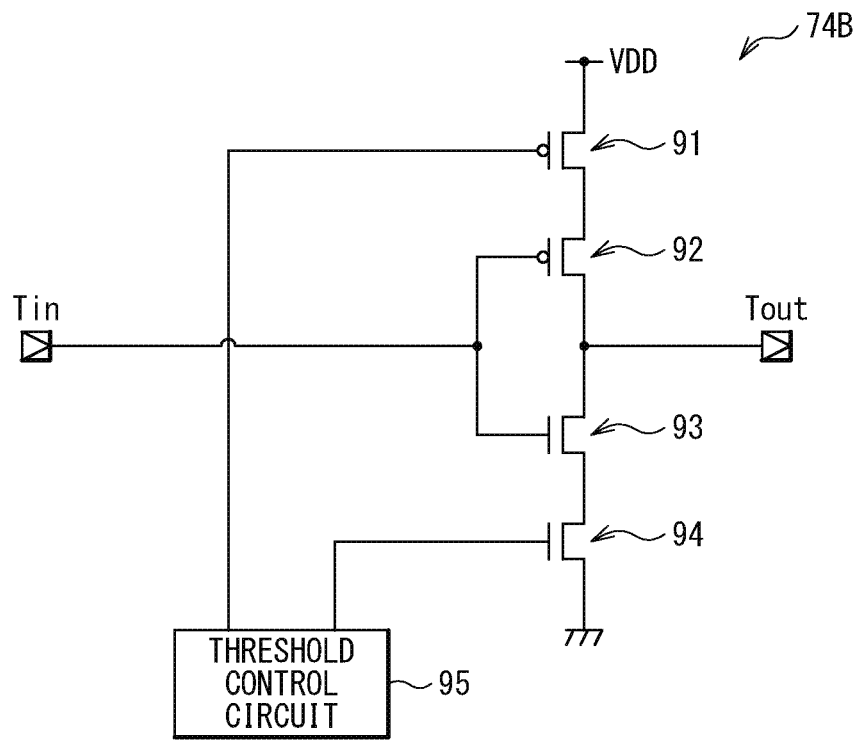

[FIG. 7]
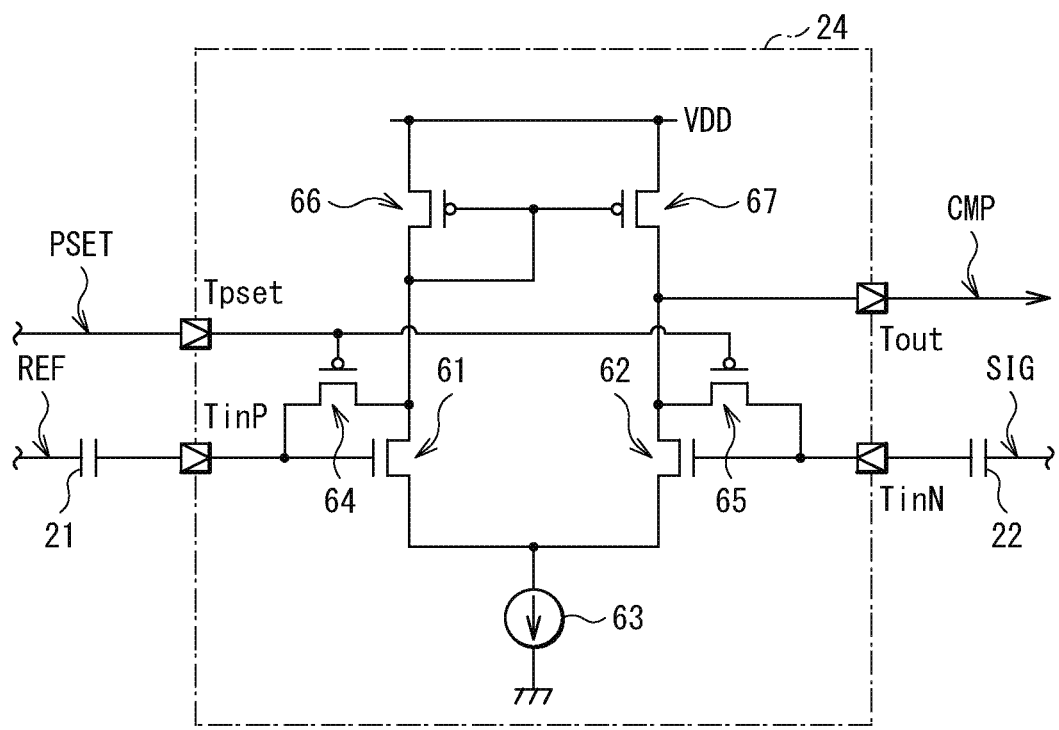

[FIG. 8]
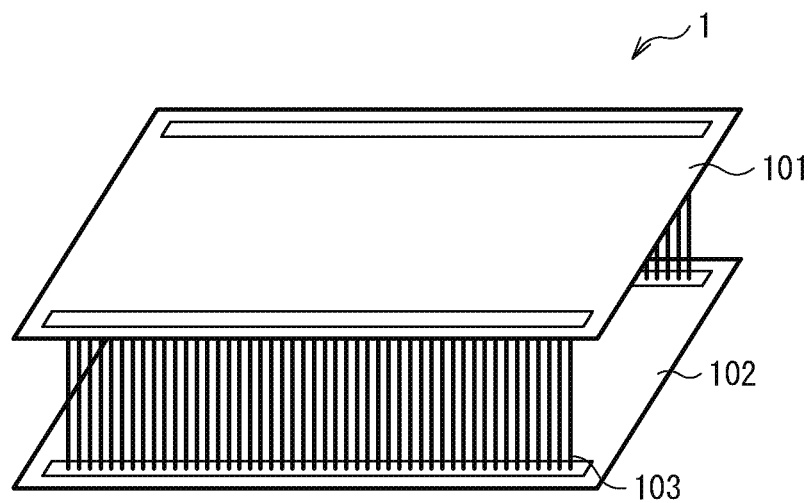

[FIG. 9]
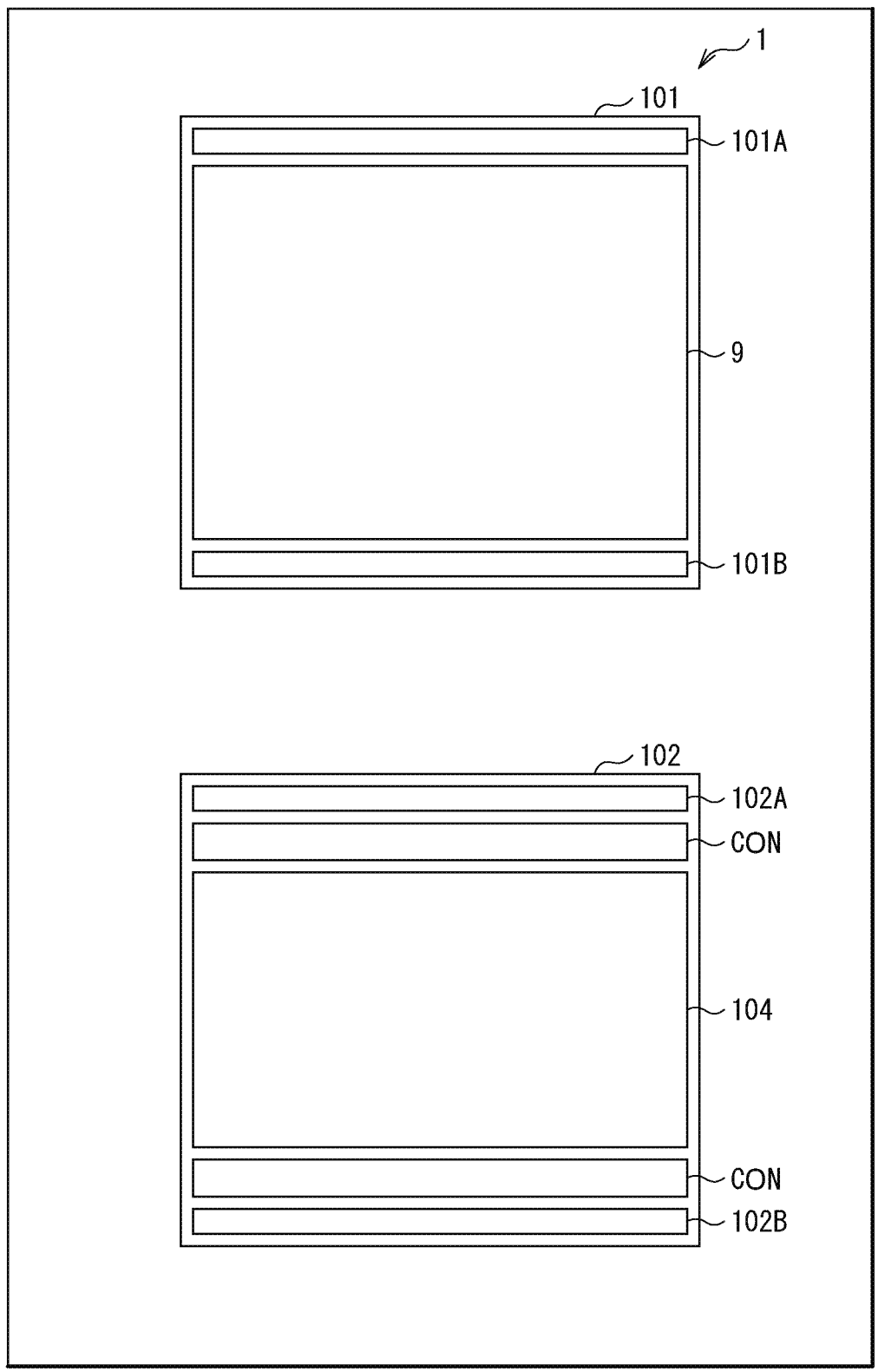

[FIG. 10]
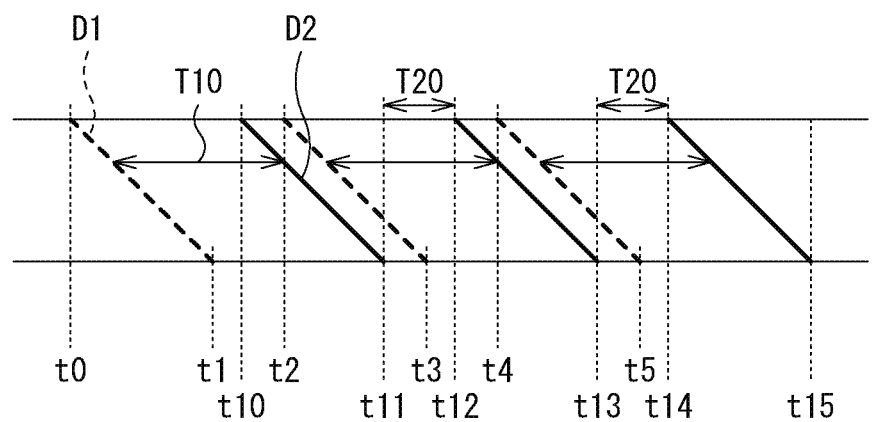

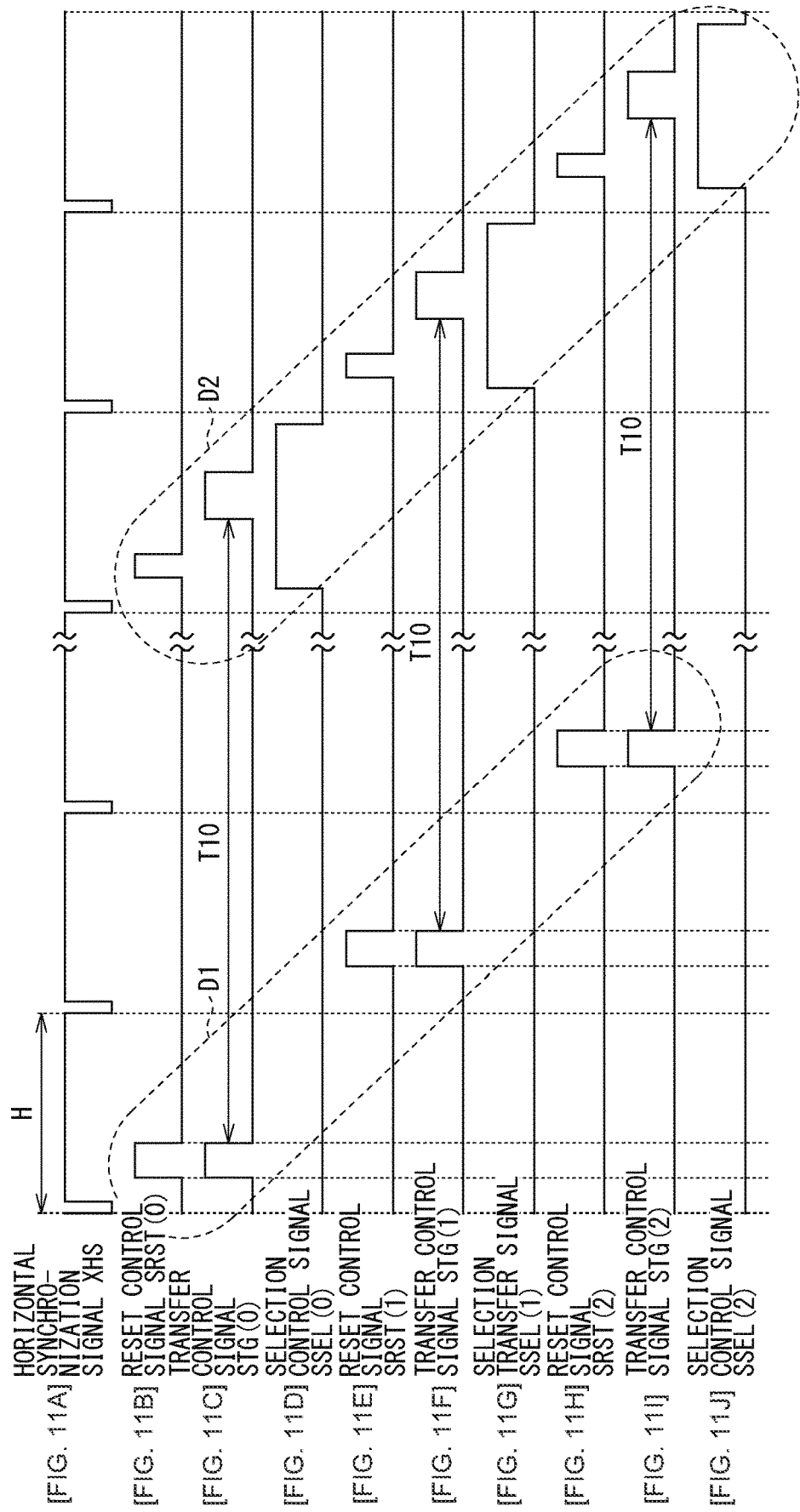

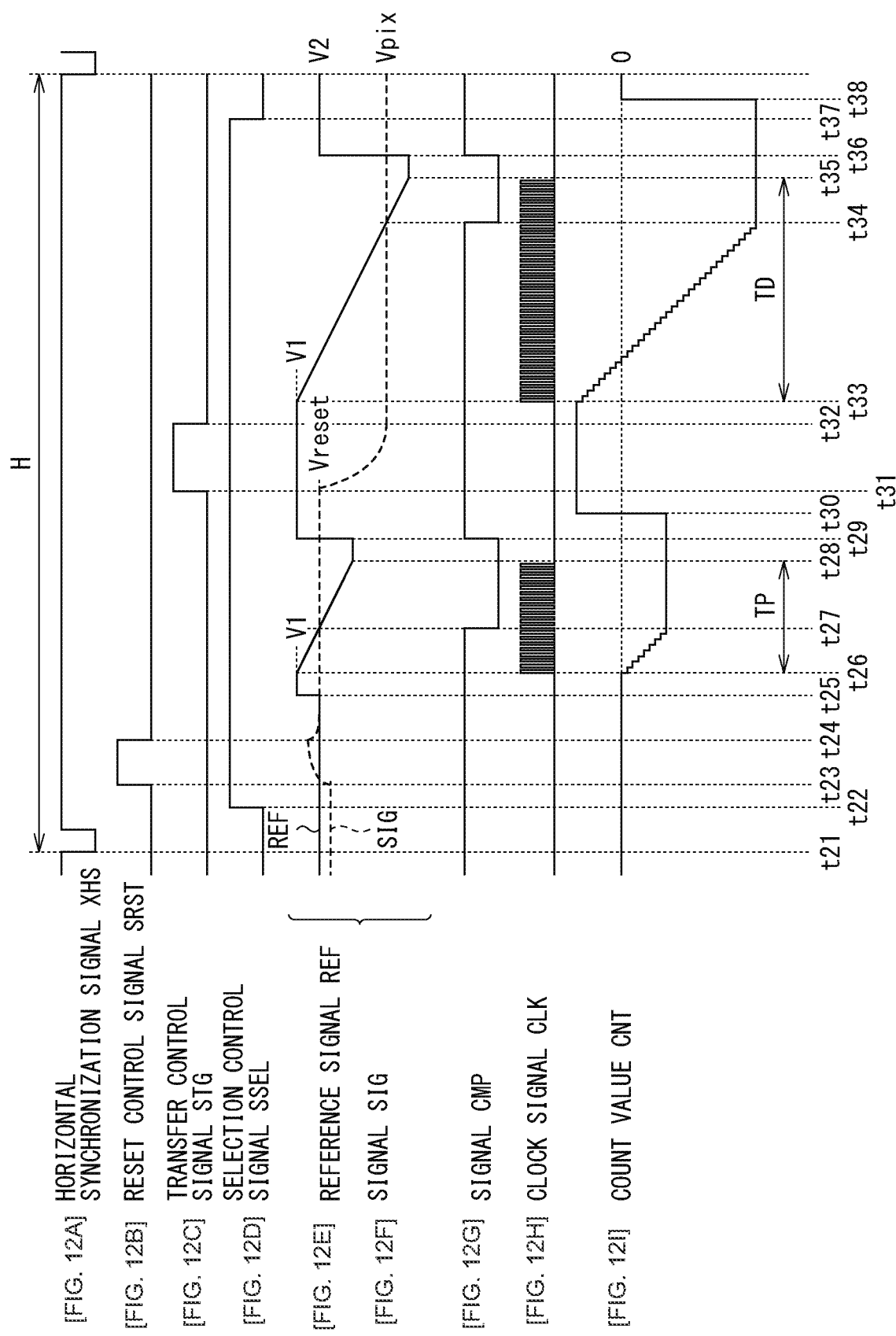

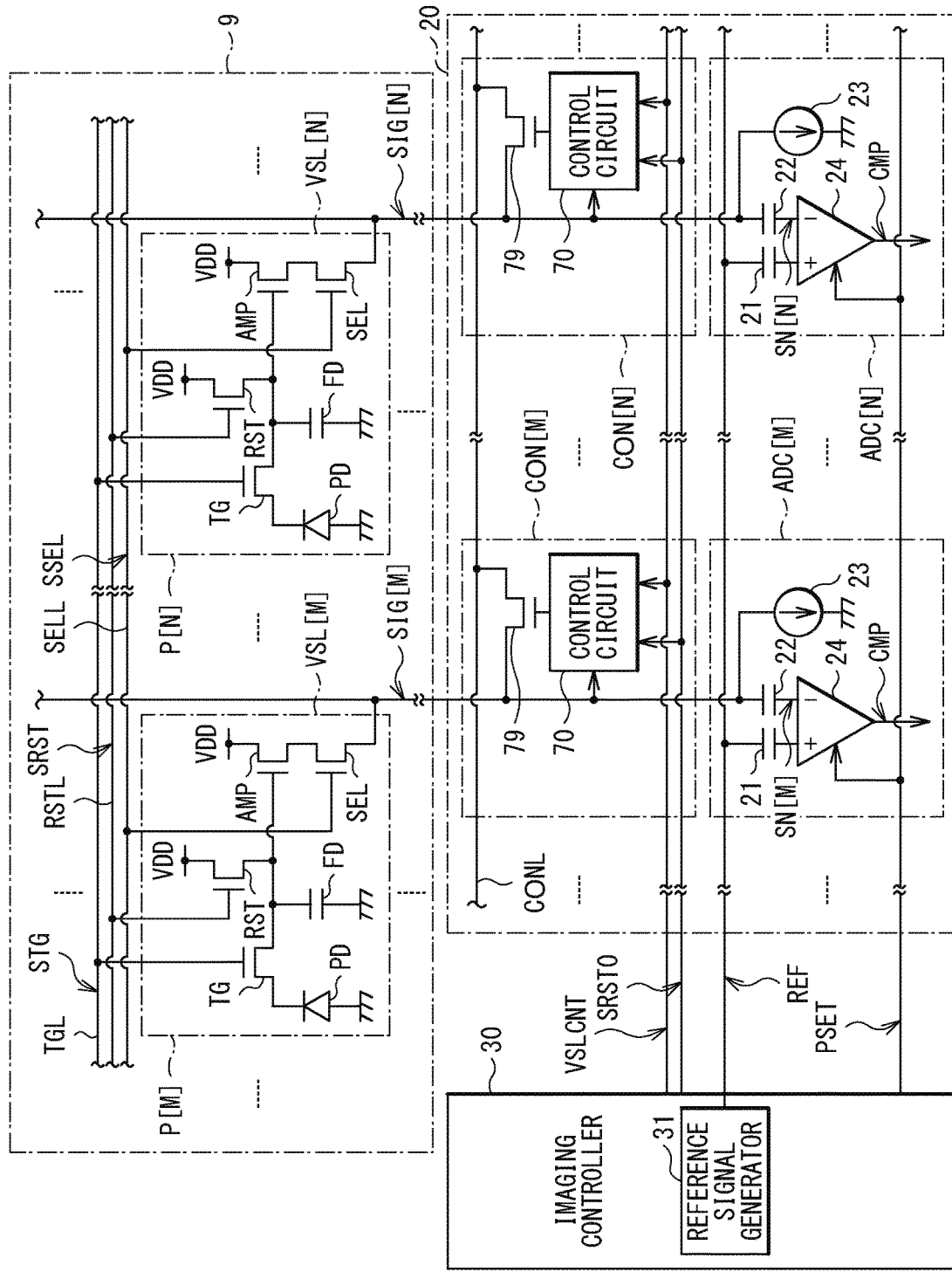
[FIG. 13]

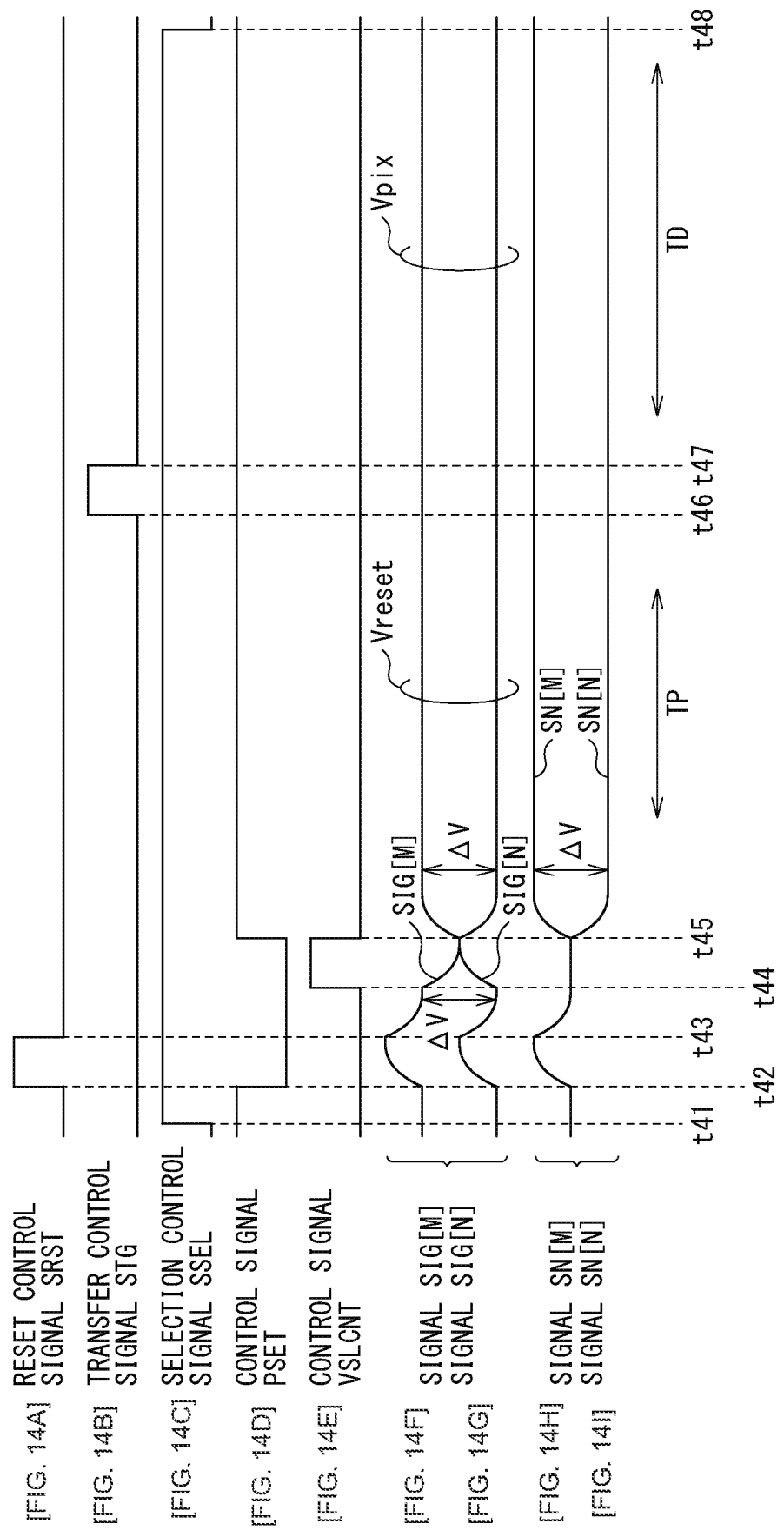

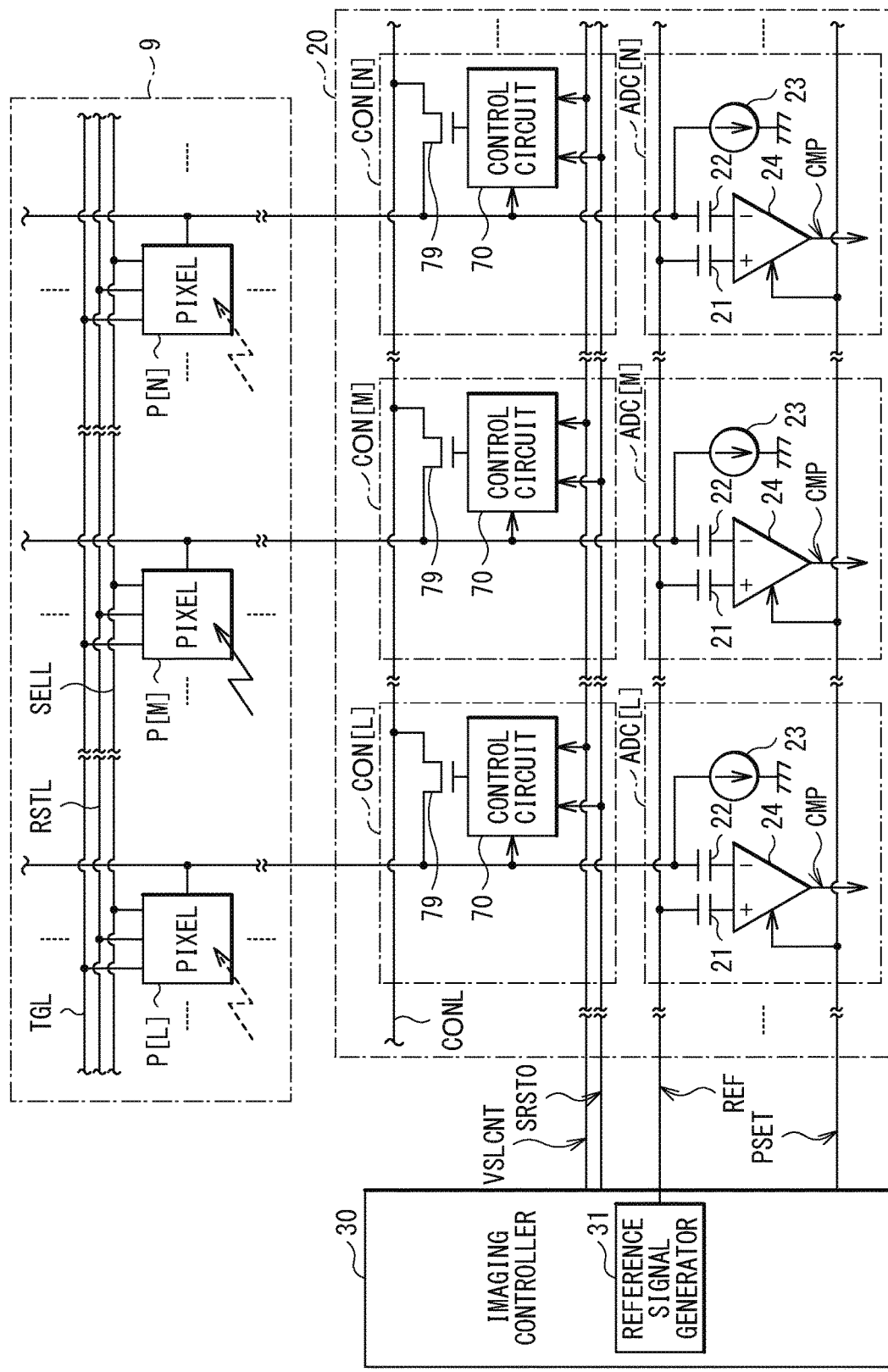
[FIG. 15]

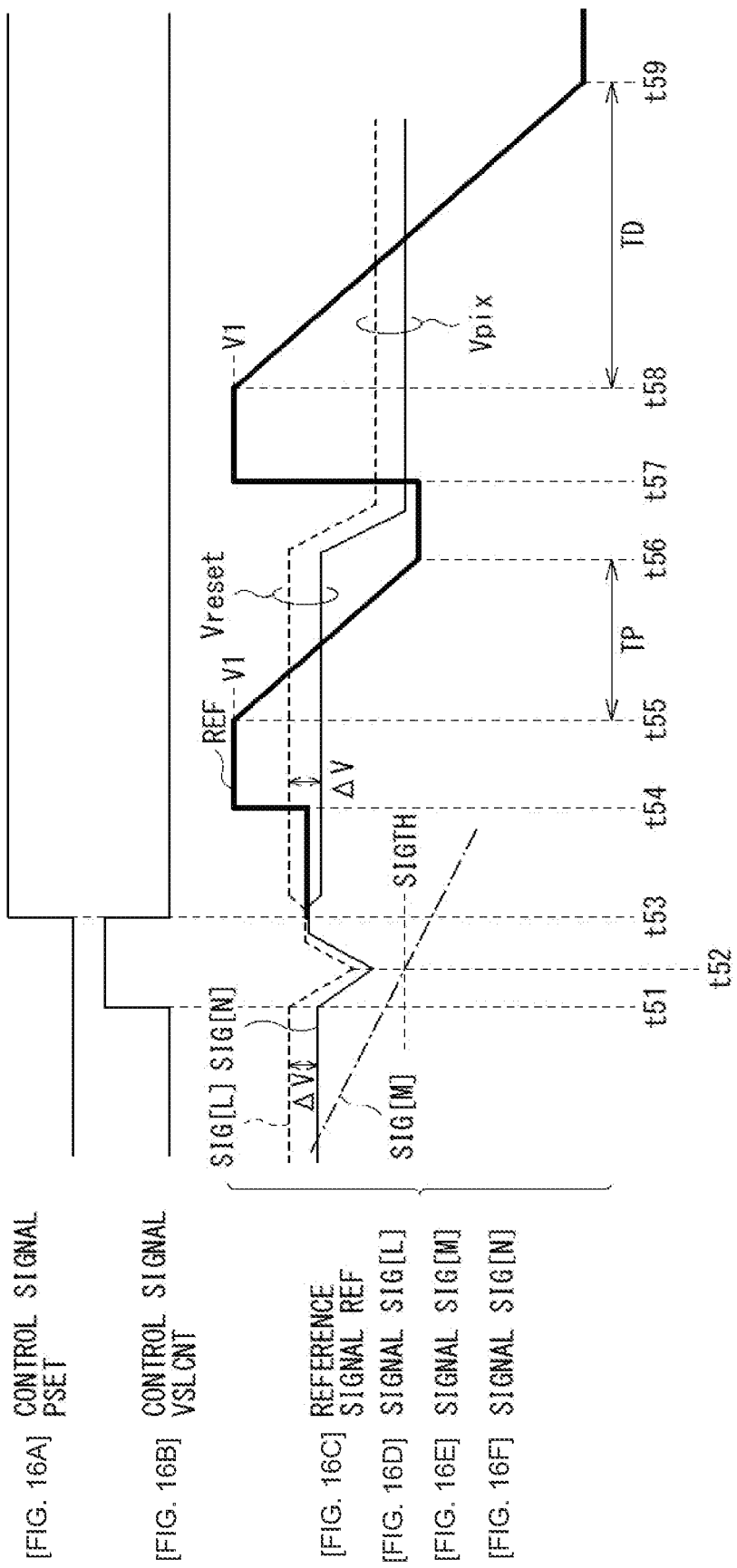

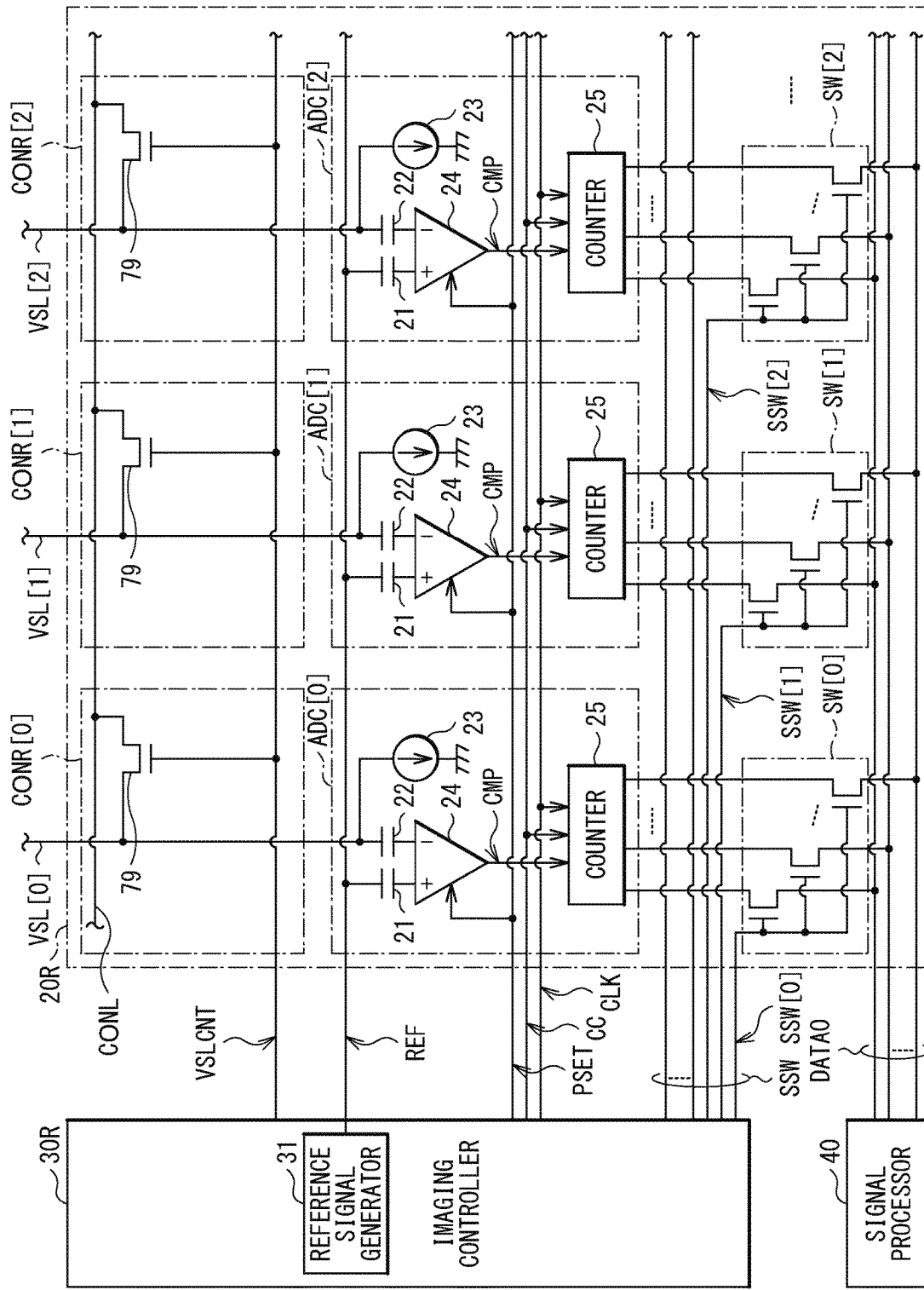
[FIG. 17]

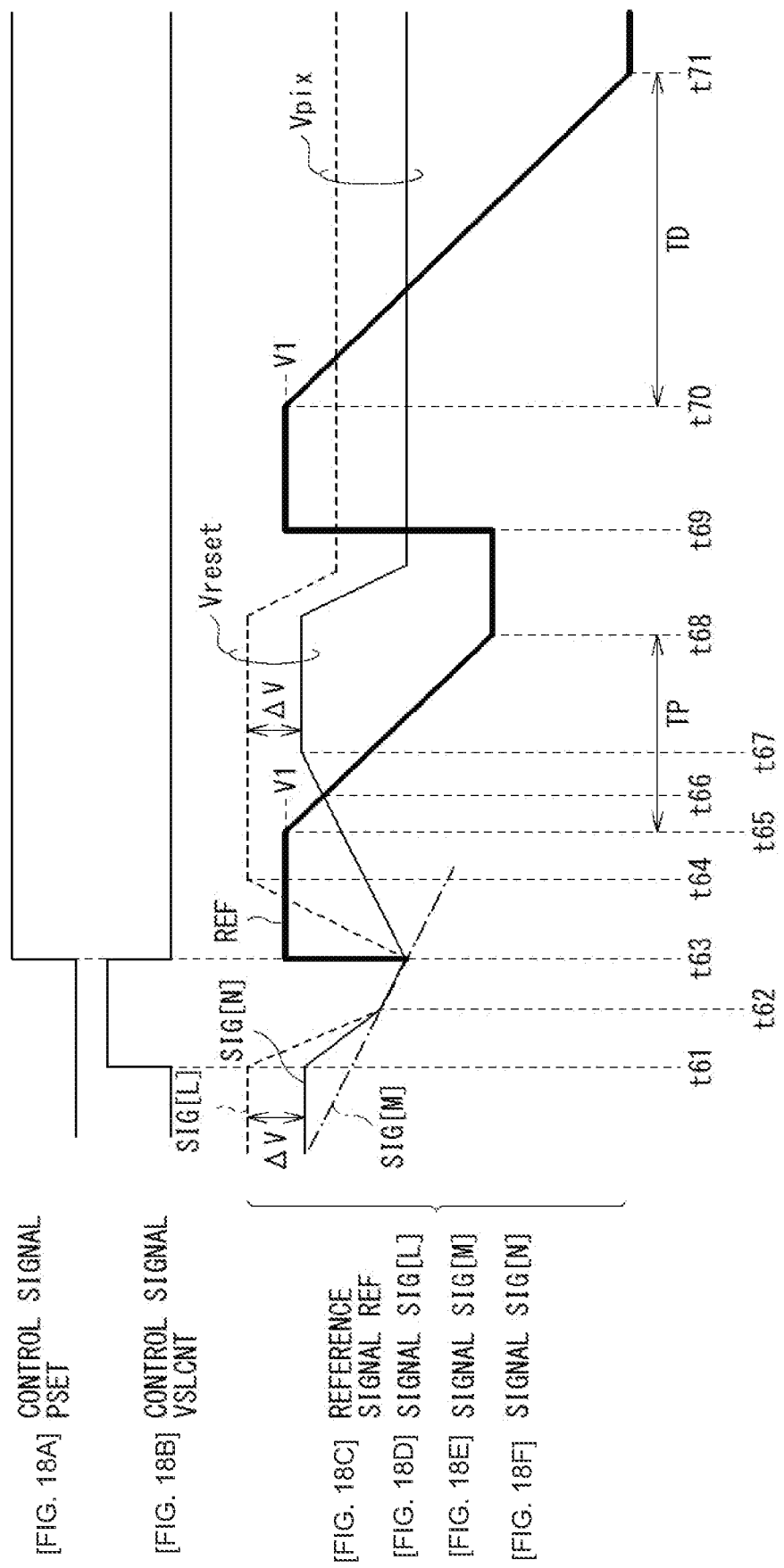

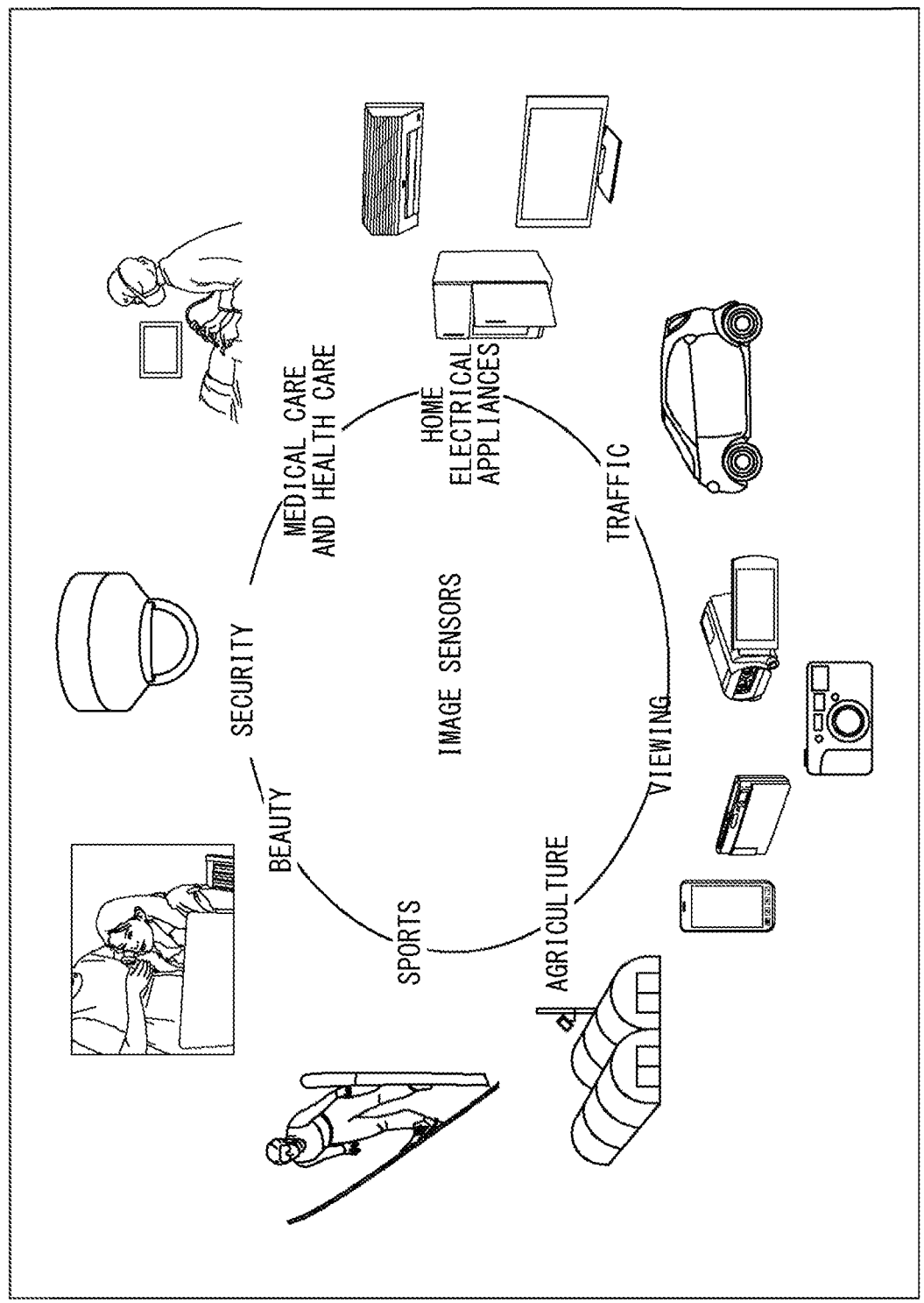
[FIG. 19]

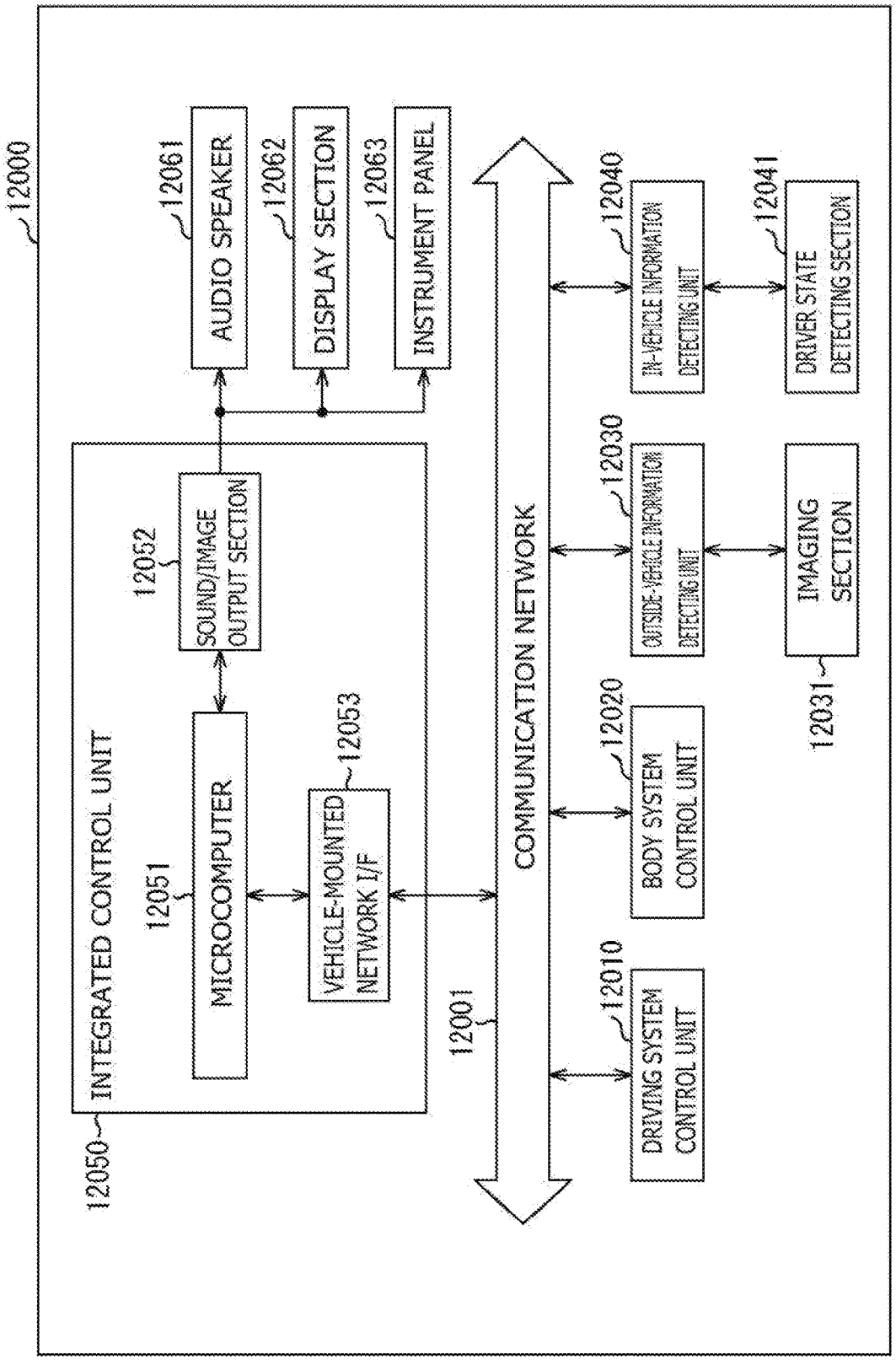
[FIG. 20]

[FIG. 21]
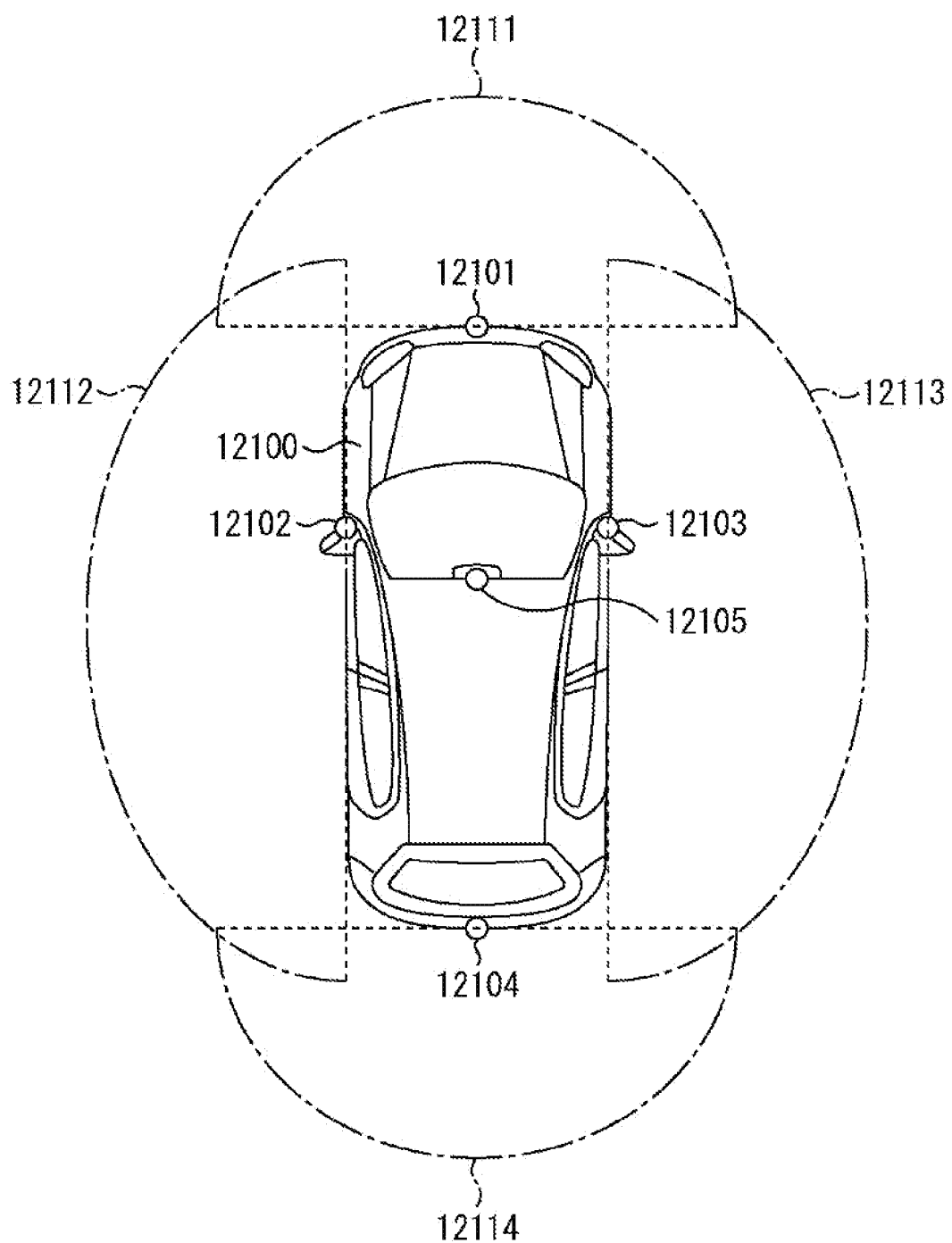

[FIG. 22]
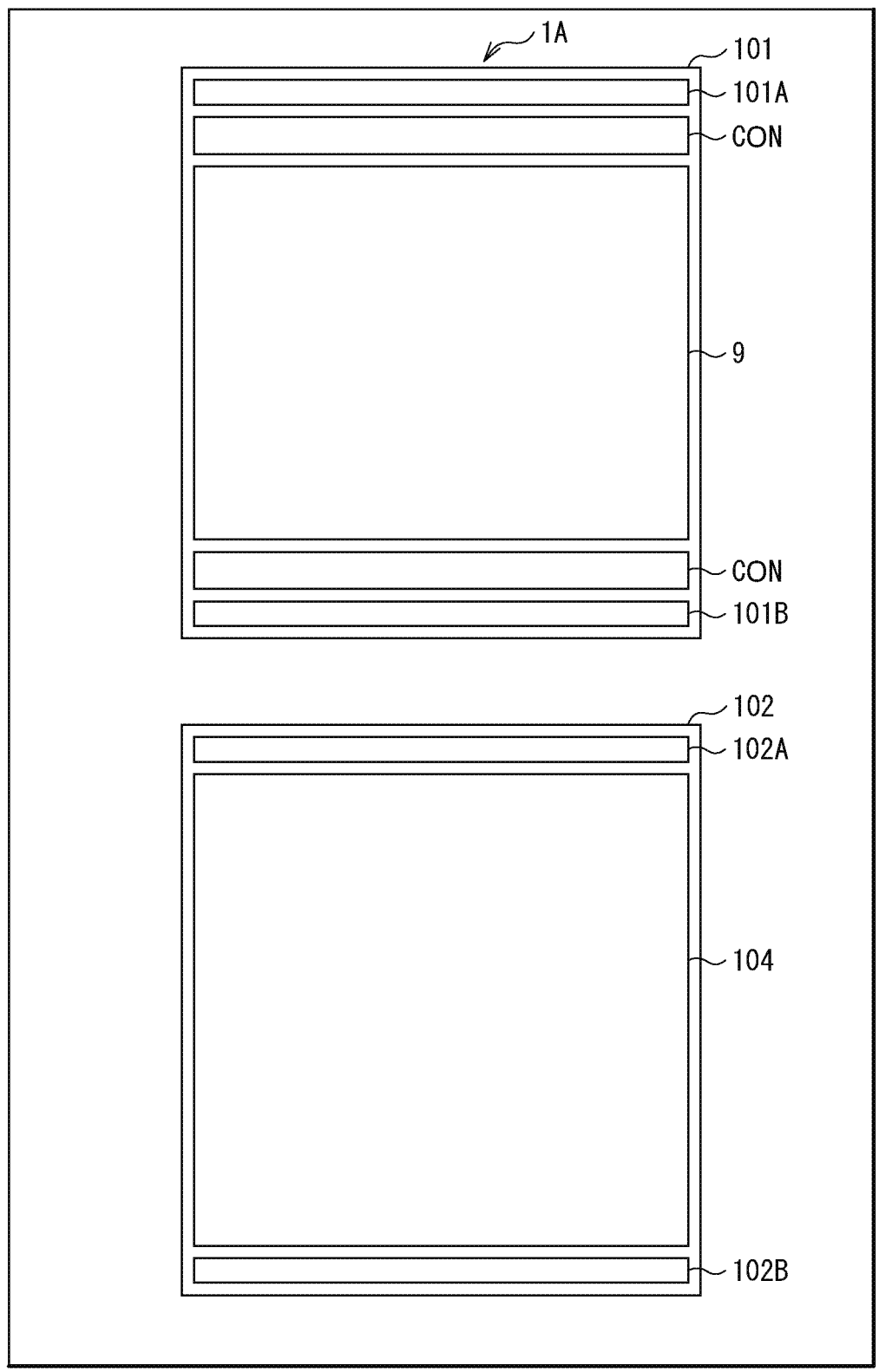

IMAGING DEVICE

CROSS REFERENCE TO RELATED APPLICATIONS

This application is a U.S. National Phase of International Patent Application No. PCT/JP2019/025361 filed on Jun. 26, 2019, which claims priority benefit of Japanese Patent Application No. JP 2018-138176 filed in the Japan Patent Office on Jul. 24, 2018. Each of the above-referenced applications is hereby incorporated herein by reference in its entirety.

TECHNICAL FIELD

The present disclosure relates to an imaging device that images a subject.

BACKGROUND ART

In an imaging device, for example, a plurality of pixels is coupled to an AD (Analog to Digital) converter via one signal line. For example, PTL 1 discloses an imaging device including a plurality of signal lines. The plurality of these signal lines is short-circuited to increase the image quality of captured images.

CITATION LIST

Patent Literature

PTL 1: International Publication No. WO 2014/132822

SUMMARY OF THE INVENTION

In this way, imaging devices are required to offer captured images having high image quality and expected to have image quality further increased.

It is desirable to provide an imaging device that makes it possible to increase the image quality of a captured image.

An imaging device according to an embodiment of the present disclosure includes an imaging unit, a connector, and a converter. The imaging unit includes a first signal line, a first pixel, a second signal line, and a second pixel. The first pixel is configured to output a first pixel voltage to the first signal line. The first pixel voltage corresponds to an amount of received light. The second pixel is configured to output a second pixel voltage to the second signal line. The second pixel voltage corresponds to the amount of received light. The connector includes a connection line, a first connection switch, a first control circuit, a second connection switch, and a second control circuit. The first connection switch is configured to couple the first signal line to the connection line by being turned on. The first control circuit is configured to control an operation of the first connection switch on the basis of a voltage in the first signal line. The second connection switch is configured to couple the second signal line to the connection line by being turned on. The second control circuit is configured to control an operation of the second connection switch on the basis of a voltage in the second signal line. The converter is coupled to the first signal line and the second signal line and configured to perform the AD conversion on the basis of each of the first pixel voltage and the second pixel voltage.

In the imaging device according to the embodiment of the present disclosure, the first pixel outputs the first pixel voltage to the first signal line and the second pixel outputs the second pixel voltage to the second signal line. The AD conversion is then performed on the basis of each of the first pixel voltage and the second pixel voltage. The operation of the first connection switch is controlled on the basis of the voltage in the first signal line. The operation of the second connection switch is controlled on the basis of the voltage in the second signal line. The first connection switch is configured to couple the first signal line to the connection line by being turned on. The second connection switch is configured to couple the second signal line to the connection line by being turned on.

The imaging device according to the embodiment of the present disclosure controls the operation of the first connection switch on the basis of the voltage in the first signal line and controls the operation of the second connection switch on the basis of the voltage in the second signal line. This makes it possible to increase the image quality of a captured image. It is to be noted that the effects described here are not necessarily limited, but any of effects described in the present disclosure may be included.

BRIEF DESCRIPTION OF DRAWING

FIG. 1 is a block diagram illustrating a configuration example of an imaging device according to an embodiment of the present disclosure.

FIG. 2 is a circuit diagram illustrating a configuration example of a pixel illustrated in FIG. 1.

FIG. 3 is a circuit diagram illustrating a configuration example of a readout unit illustrated in FIG. 1.

FIG. 4 is a circuit diagram illustrating a configuration example of a control circuit illustrated in FIG. 3.

FIGS. 5A, 5B, 5C, and 5D are timing waveform diagrams illustrating an operation example of the control circuit illustrated in FIG. 4.

FIG. 6A is a circuit diagram illustrating a configuration example of an inverter illustrated in FIG. 4.

FIG. 6B is a circuit diagram illustrating another configuration example of the inverter illustrated in FIG. 4.

FIG. 7 is a circuit diagram illustrating a configuration example of a comparator illustrated in FIG. 3.

FIG. 8 is an explanatory diagram illustrating an implementation example of the imaging device illustrated in FIG. 1.

FIG. 9 is another explanatory diagram illustrating an implementation example of the imaging device illustrated in FIG. 8.

FIG. 10 is a timing diagram illustrating an operation example of the imaging device illustrated in FIG. 1.

FIGS. 11A, 11B, 11C, 11D, 11E, 11F, 11G, 11H, 11I, and 11J are timing waveform diagram illustrating an operation example of the imaging device illustrated in FIG. 1.

FIGS. 12A, 12B, 12C, 12D, 12E, 12F, 12G, 12H, and 12I are another timing waveform diagrams illustrating an operation example of the imaging device illustrated in FIG. 1.

FIG. 13 is a circuit diagram illustrating a configuration example of a main unit of the imaging device illustrated in FIG. 1.

FIGS. 14A, 14B, 14C, 14D, 14E, 14F, 14G, 14H, and 14I are another timing waveform diagrams illustrating an operation example of the imaging device illustrated in FIG. 1.

FIG. 15 is another circuit diagram illustrating a configuration example of the main unit of the imaging device illustrated in FIG. 1.

FIGS. 16A, 16B, 16C, 16D, 16E, and 16F are another timing waveform diagrams illustrating an operation example of the imaging device illustrated in FIG. 1.

FIG. 17 is a circuit diagram illustrating a configuration example of a main unit of an imaging device according to a comparative example.

FIGS. 18A, 18B, 18C, 18D, 18E, and 18F are timing waveform diagrams illustrating an operation example of the imaging device according to the comparative example.

FIG. 19 is an explanatory diagram illustrating a usage example of the imaging device.

FIG. 20 is a block diagram depicting an example of schematic configuration of a vehicle control system.

FIG. 21 is a diagram of assistance in explaining an example of installation positions of an outside-vehicle information detecting section and an imaging section.

FIG. 22 is an explanatory diagram illustrating an implementation example of an imaging device according to a modification example.

MODES FOR CARRYING OUT THE INVENTION

The following describes embodiment of the present disclosure in detail with reference to the drawings. It is to be noted that description is given in the following order.
1. Embodiment
2. Usage Example of Imaging Device
3. Example of Application to Mobile Body

1. Embodiment

[Configuration Example]

FIG. 1 illustrates a configuration example of an imaging device (imaging device 1) according to an embodiment. The imaging device 1 includes a pixel array 9, a driving unit 10, a readout unit 20, an imaging controller 30, and a signal processor 40.

The pixel array 9 includes a plurality of pixels P disposed in a matrix. The pixels P are each configured to generate a pixel voltage Vpix corresponding to the amount of received light.

FIG. 2 illustrates a configuration example of the pixel P. The pixel array 9 includes a plurality of transfer control lines TGL, a plurality of reset control lines RSTL, a plurality of selection control lines SELL, and a plurality of signal lines VSL. The transfer control lines TGL each extend in the horizontal direction (lateral direction in FIG. 2) and have one end coupled to the driving unit 10. The driving unit 10 applies a transfer control signal STG to this transfer control line TGL. The reset control lines RSTL each extend in the horizontal direction and have one end coupled to the driving unit 10. The driving unit 10 applies a reset control signal SRST to this reset control line RSTL. The selection control lines SELL each extend in the horizontal direction and have one end coupled to the driving unit 10. The driving unit 10 applies a selection control signal SSEL to this selection control line SELL. The signal lines VSL each extend in the vertical direction (longitudinal direction in FIG. 2) and have one end coupled to the readout unit 20. The plurality of pixels P for one row is included in a pixel line L. The plurality of pixels P is provided side by side in the lateral direction in FIGS. 1 and 2.

The pixel P includes a photodiode PD, a transistor TG, a floating diffusion FD, and transistors RST, AMP, and SEL. Each of the transistors TG, RST, AMP, and SEL is an N-type MOS (Metal Oxide Semiconductor) transistor in this example.

The photodiode PD is a photoelectric conversion element that generates and accumulates electric charges in the amount corresponding to the amount of received light. The photodiode PD has the anode grounded and the cathode coupled to the source of the transistor TG.

The transistor TG has the gate coupled to the transfer control line TGL, the source coupled to the cathode of the photodiode PD, and the drain coupled to the floating diffusion FD.

The floating diffusion FD is configured to accumulate the electric charges transferred from the photodiode PD. The floating diffusion FD includes, for example, a diffusion layer formed on the surface of the semiconductor substrate. FIG. 2 illustrates the floating diffusion FD by using a symbol of a capacitor.

The transistor RST has the gate coupled to the reset control line RSTL, the drain supplied with a power supply voltage VDD, and the source coupled to the floating diffusion FD.

The transistor AMP has the gate coupled to the floating diffusion FD, the drain supplied with the power source voltage VDD, and the source coupled to the drain of the transistor SEL.

The transistor SEL has the gate coupled to the selection control line SELL, the drain coupled to the source of the transistor AMP, and the source coupled to the signal line VSL.

This configuration electrically couples the pixel P to the signal line VSL by turning on the transistor SEL on the basis of the selection control signal SSEL applied to the selection control line SELL in the pixel P. This couples the transistor AMP to a current source 23 (described below) of the readout unit 20 and the transistor AMP operates as a so-called source follower. The pixel P then outputs, as a signal SIG, the voltage corresponding to the voltage in the floating diffusion FD to the signal line VSL. Specifically, as described below, the pixel P outputs a reset voltage Vreset in a P-phase period TP and outputs the pixel voltage Vpix corresponding to the amount of received light in the D-phase period TD. The pixel P outputs these reset voltage Vreset and pixel voltage Vpix by using the signals SIG.

The driving unit 10 (FIG. 1) is configured to sequentially drive the plurality of pixels P in the pixel array 9 in units of the pixel lines L on the basis of an instruction from the imaging controller 30. Specifically, the driving unit 10 drives the plurality of pixels P in the pixel array 9 in units of the pixel lines L by applying the plurality of respective transfer control signals STG to the plurality of transfer control lines TGL, applying the plurality of respective reset control signals SRST to the plurality of reset control lines RSTL, and applying the plurality of respective selection control signals SSEL to the plurality of selection control lines SELL in the pixel array 9.

The readout unit 20 is configured to generate an image signal DATA0 by performing AD conversion on the basis of the signal SIG supplied from the pixel array 9 via the signal line VSL.

FIG. 3 illustrates a configuration example of the readout unit 20. It is to be noted that FIG. 3 also illustrates the imaging controller 30 and the signal processor 40 in addition to the readout unit 20. The readout unit 20 includes a connection line CONL, a plurality of connectors CON (connectors CON[0], CON[1], CON[2], . . . ), a plurality of AD (Analog to Digital) converters ADC (AD converters ADC[0], ADC[1], ADC[2], . . . ), a plurality of switch sections SW (switch sections SW[0], SW[1], SW[2], . . . ), and a bus wiring line BUS.

The connection line CONL extends in the horizontal direction (lateral direction in FIG. 3) and is formed over the plurality of connectors CON.

Each of the plurality of connectors CON is configured to couple the signal line VSL to the connection line CONL on the basis of the voltage of the signal SIG and control signals SRST0 and VSLCNT supplied from the imaging controller 30. The plurality of connectors CON is provided in association with the plurality of signal lines VSL. Specifically, the 0th connector CON[0] is provided in association with a 0th signal line VSL[0], the first connector CON[1] is provided in association with a first signal line VSL[1], and the second connector CON[2] is provided in association with a second signal line VSL[2].

FIG. 4 illustrates a configuration example of the connector CON. The connector CON includes a control circuit 70 and a transistor 79.

The control circuit 70 is configured to control the operation of the transistor 79 on the basis of the voltage of the signal SIG and the control signals SRST0 and VSLCNT supplied from the imaging controller 30. The connector CON includes transistors 71 to 73, an inverter 74, and an AND circuit 75. The transistor 71 is an N-type MOS transistor and the transistors 72 and 73 are P-type MOS transistors. The transistor 71 has the gate supplied with the control signal SRST0, the drain coupled to the drains of the transistors 72 and 73 and the input terminal of the inverter 74, and the source grounded. The transistor 72 has the gate coupled to the signal line VSL, the source supplied with the power supply voltage VDD, and the drain coupled to the drains of the transistors 71 and 73 and the input terminal of the inverter 74. The transistor 73 has the gate coupled to the output terminal of the inverter 74 and a first input terminal of the AND circuit 75, the source supplied with the power supply voltage VDD, and the drain coupled to the drains of the transistors 71 and 72 and the input terminal of the inverter 74. The inverter 74 has the input terminal coupled to the drains of the transistors 71 to 73 and the output terminal coupled to the gate of the transistor 73 and the first input terminal of the AND circuit 75. The inverter 74 is configured to have a threshold voltage Vth changeable. The AND circuit 75 has the first input terminal coupled to the output terminal of the inverter 74 and the gate of the transistor 73, a second input terminal supplied with the control signal VSLCNT, and the output terminal coupled to the gate of the transistor 79.

The transistor 79 is an N-type MOS transistor. The transistor 79 has the gate coupled to the output terminal of the AND circuit 75 of the control circuit 70, the source coupled to the signal line VSL, and the drain coupled to the connection line CONL.

FIGS. 5A, 5B, 5C, and 5D illustrate an operation example of the control circuit 70. FIG. 5A indicates the waveform of the control signal SRST0, FIG. 5B indicates the waveform of the signal SIG in the signal line VSL, FIG. 5C indicates the waveform of a voltage Vin inputted to the inverter 74, and FIG. 5D indicates the waveform of a voltage Vout outputted from the inverter 74. In FIGS. 5B, 5C, and 5D, the solid lines each represent the voltage of the signal SIG remaining as a high voltage as indicated in FIG. 5B and the broken lines each represent the voltage of the signal SIG gradually decreasing as indicated in FIG. 5B.

When the voltage of the control signal SRST0 is changed from the low level to the high level at a timing t101, the transistor 71 is turned on and the voltage Vin is set at 0 V (FIG. 5C). This brings the voltage Vout outputted from the inverter 74 to the high level (FIG. 5D).

Then, when the voltage of the control signal SRST0 is changed from the high level to the low level at a timing t102, the transistor 71 is turned off. Afterward, currents flow through the transistor 72 in accordance with the voltage of the signal SIG to gradually increase the voltage Vin.

For example, in a case where the voltage of the signal SIG remains as a high voltage as represented by the solid line in FIG. 5B, the voltage Vin slowly increases because less currents flow through the transistor 72 (FIG. 5C). In addition, in a case where the voltage of the signal SIG gradually decreases as represented by the broken line in FIG. 5B, the voltage Vin increases at higher speed because more currents flow through the transistor 72. Then, in a case where the voltage Vin exceeds the threshold voltage Vth of the inverter 74, the voltage Vout outputted from the inverter 74 is brought to the low level (FIG. 5D). In this example, the voltage Vin exceeds the threshold voltage Vth and the voltage Vout is accordingly changed from the high level to the low level at a timing t103. This turns on the transistor 73 and the voltage Vin is changed toward the high level (FIG. 5C).

This configuration causes the connector CON to turn on the transistor 79 in a case where the voltage of the signal SIG is higher than a threshold voltage SIGTH in the period in which the voltage of the control signal VSLCNT is in the high level. As a result, the signal line VSL is coupled to the connection line CONL. In addition, the connector CON turns off the transistor 79 in a case where the voltage of the signal SIG is lower than this threshold voltage SIGTH in the period in which the voltage of the control signal VSLCNT is in the high level. As a result, the signal line VSL is not coupled to the connection line CONL.

The inverter 74 is configured to have the threshold voltage Vth changeable. For example, an inverter 74A illustrated in FIG. 6A or an inverter 74B illustrated in FIG. 6B is usable for the inverter 74 like this.

The inverter 74A (FIG. 6A) includes transistors 81 and 82, a plurality of circuits 83, and a threshold control circuit 86. The transistor 81 is a P-type MOS transistor. The transistor 81 has the gate coupled to the gate of the transistor 82 and an input terminal Tin of the inverter 74A, the source supplied with the power supply voltage VDD, and the drain coupled to the drain of the transistor 82 and an output terminal Tout of the inverter 74A. The transistor 82 is an N-type MOS transistor. The transistor 82 has the gate coupled to the gate of the transistor 81 and the input terminal Tin of the inverter 74A, the source grounded, and the drain coupled to the drain of the transistor 81 and the output terminal Tout of the inverter 74A. Each of the plurality of circuits 83 includes a switch 84 and a transistor 85. The switch 84 has one end coupled to the input terminal Tin of the inverter 74A and the other end coupled to the gate of the transistor 85. The switch 84 is turned on and off between the one end and the other end on the basis of a control signal supplied from the threshold control circuit 86. The transistor 85 has the gate coupled to the other end of the switch 84, the drain coupled to the output terminal Tout of the inverter 74A, and has the source grounded. The threshold control circuit 86 is configured to control the threshold voltage Vth of the inverter 74A by supplying the switches 84 of the plurality of circuits 83 with control signals. This configuration changes the threshold voltage Vth in the inverter 74A in accordance with the number of circuits 83 that have the switches 84 turned on among the plurality of circuits 83.

The inverter 74B (FIG. 6B) includes transistors 91 to 94 and a threshold control circuit 95. The transistors 91 and 92 is P-type MOS transistors and the transistors 93 and 94 are N-type MOS transistors. The transistor 91 has the gate supplied with a first control voltage from the threshold control circuit 95, the source supplied with the power supply voltage VDD, and the drain coupled to the source of the transistor 92. The transistor 92 has the gate coupled to the gate of the transistor 93 and the input terminal Tin of the inverter 74B, the source coupled to the drain of the transistor 91, and the drain coupled to the drain of the transistor 93 and the output terminal Tout. The transistor 93 has the gate coupled to the gate of the transistor 92 and the input terminal Tin of the inverter 74B, the drain coupled to the drain of the transistor 92 and the output terminal Tout of the inverter 74B, and the source coupled to the drain of the transistor 94. The transistor 94 has the gate supplied with a second control voltage from the threshold control circuit 95, the drain coupled to the source of the transistor 93, and the source grounded. The threshold control circuit 95 is configured to control the threshold voltage Vth of the inverter 74B by supplying the gate of the transistor 91 with the first control voltage and supplying the gate of the transistor 94 with the second control voltage. This configuration changes the threshold voltage Vth in the inverter 74B in accordance with the on-resistance value in the transistor 91 and the on-resistance value in the transistor 94.

Each of the plurality of AD converters ADC (FIG. 3) is configured to convert the voltage of the signal SIG supplied from the pixel array 9 into a digital code CODE by performing AD conversion on the basis of the signal SIG. The plurality of AD converters ADC is provided in association with the plurality of signal lines VSL. Specifically, the 0th AD converter ADC[0] is provided in association with the 0th signal line VSL[0], the first AD converter ADC[1] is provided in association with the first signal line VSL[1], and the second AD converter ADC[2] is provided in association with the second signal line VSL[2]. The AD converters ADC each include capacitors 21 and 22, the current source 23, a comparator 24, and a counter 25.

The capacitor 21 has one end supplied with a reference signal REF from the imaging controller 30 and the other end coupled to the positive input terminal of the comparator 24. As described below, this reference signal REF has a so-called ramp waveform in which a voltage level gradually decreases with the lapse of time in the two periods (P-phase period TP and D-phase period TD) for performing AD conversion. The capacitor 22 has one end coupled to the signal line VSL and the other end coupled to the negative input terminal of the comparator 24. The current source 23 has one end coupled to the signal line VSL and the other end grounded. The current source 23 is configured to cause a current having a predetermined current value to flow from the signal line VSL to the ground.

The comparator 24 has the positive input terminal coupled to the other end of the capacitor 21, the negative input terminal coupled to the other end of the capacitor 22, and the output terminal coupled to the counter 25. The comparator 24 is configured to compare the voltage at the positive input terminal with the voltage at the negative input terminal and output a result of the comparison as a signal CMP. In addition, this comparator 24 is configured to perform a zero adjustment of setting the voltage values in the capacitors 21 and 22 in a predetermined period described below on the basis of the control signal PSET supplied from the imaging controller 30.

FIG. 7 illustrates a configuration example of the comparator 24. The comparator 24 includes transistors 61 and 62, a current source 63, and transistors 64 to 67. The transistors 61 and 62 are N-type MOS transistors and the transistors 64 to 67 are P-type MOS transistors. The transistor 61 has the gate coupled to the source of the transistor 64 and a positive input terminal TinP of the comparator 24, the drain coupled to the drains of the transistors 64 and 66 and the gates of the transistors 66 and 67, and the source coupled to the source of the transistor 62 and one end of the current source 63. The transistor 62 has the gate coupled to the source of the transistor 65 and a negative input terminal TinN of the comparator 24, the drain coupled to the drains of the transistors 65 and 67 and the output terminal Tout of the comparator 24, and the source coupled to the source of the transistor 61 and the one end of the current source 63. The current source 63 has the one end coupled to the sources of the transistors 61 and 62 and the other end grounded. The transistor 64 has the gate coupled to a control input terminal Tpset, the source coupled to the gate of the transistor 61 and the positive input terminal TinP of the comparator 24, and the drain coupled to the drains of the transistors 61 and 66 and the gates of the transistors 66 and 67. The transistor 65 has the gate coupled to the control input terminal Tpset, the source coupled to the gate of the transistor 62 and the negative input terminal TinN of the comparator 24, and the drain coupled to the drains of the transistors 62 and 67 and the output terminal Tout of the comparator 24. The transistor 66 has the gate coupled to the drains of the transistors 61, 64, and 66 and the gate of the transistor 67, the source supplied with the power supply voltage VDD, and the drain coupled to the gates of the transistors 66 and 67 and the drains of the transistors 61 and 64. The transistor 67 has the gate coupled to the gate of the transistor 66 and the drains of the transistors 61, 64, and 66, the source supplied with the power supply voltage VDD, and the drain coupled to the drains of the transistors 62 and 65 and to the output terminal Tout of the comparator 24.

This configuration causes the comparator 24 to compare the voltage at the positive input terminal with the voltage at the negative input terminal and output a result of the comparison as the signal CMP. In addition, this comparator 24 performs a zero adjustment of setting the voltage values in the capacitors 21 and 22 by turning on the transistors 64 and 65 in a predetermined period described below on the basis of the control signal PSET.

The counter 25 (FIG. 3) is configured to perform a counting operation of counting the pulses of a clock signal CLK supplied from the imaging controller 30 on the basis of the signal CMP supplied from the comparator 24 and a control signal CC supplied from the imaging controller 30. The counter 25 includes a latch in the output stage. This latch is configured to output a count value CNT as the digital code CODE having a plurality of bits. The count value CNT is obtained by the counter 25.

Each of the plurality of switch sections SW is configured to supply the bus wiring line BUS with the digital code CODE outputted from the AD converter ADC on the basis of a control signal SSW supplied from the imaging controller 30. The plurality of switch sections SW is provided in association with the plurality of AD converters ADC. Specifically, the 0th switch section SW[0] is provided in association with the 0th AD converter ADC[0], the first switch section SW[1] is provided in association with the first AD converter ADC[1], and the second switch section SW[2] is provided in association with the second AD converter ADC[2].

The switch sections SW each include the same number of transistors as the number of bits of the digital code CODE in this example. These transistors are controlled to be turned on and off on the basis of the respective bits of the control signals SSW (control signals SSW[0], SSW[1], SSW[2], ... ) supplied from the imaging controller 30. Specifically, for example, turning on the respective transistors on the basis of the control signal SSW[0] causes the 0th switch section SW[0] to supply the digital code CODE outputted from the 0th AD converter ADC[0] to the bus wiring line BUS. Similarly, for example, turning on the respective transistors on the basis of the control signal SSW[1] causes the first switch section SW[1] to supply the digital code CODE outputted from the first AD converter ADC[1] to the bus wiring line BUS. The same applies to the other switch sections SW.

The bus wiring line BUS includes a plurality of wiring lines and is configured to transmit the digital codes CODE outputted from the AD converters ADC. The bus wiring line BUS is coupled to the plurality of switch sections SW and coupled to the signal processor 40. The readout unit 20 uses this bus wiring line BUS to sequentially transfer the plurality of digital codes CODE supplied from the AD converters ADC to the signal processor 40 as the image signals DATA0 (data transfer operation).

The imaging controller 30 (FIG. 1) is configured to control the operation of the imaging device 1 by supplying control signals to the driving unit 10, the readout unit 20, and the signal processor 40 and controlling the operations of these circuits. Specifically, the imaging controller 30 performs control to cause the driving unit 10 to sequentially drive the plurality of pixels P in the pixel array 9 in units of the pixel lines L, for example, by supplying the driving unit 10 with a control signal. In addition, the imaging controller 30 performs control to cause the readout unit 20 to generate the image signal DATA0 on the basis of the signal SIG by supplying the readout unit 20 with the reference signal REF, the clock signal CLK, the control signals VSLCNT, SRST0, PSET, and CC, and the control signals SSW (control signals SSW[0], SSW[1], SSW[2], ... ). In addition, the imaging controller 30 controls the operation of the signal processor 40 by supplying the signal processor 40 with control signals.

The imaging controller 30 includes a reference signal generator 31. The reference signal generator 31 is configured to generate the reference signal REF. The reference signal REF has a so-called ramp waveform in which a voltage level gradually decreases with the lapse of time in the two periods (P-phase period TP and D-phase period TD) for performing AD conversion. The reference signal generator 31 supplies this reference signal REF to each of the plurality of AD converters ADC of the readout unit 20.

The signal processor 40 is configured to generate an image signal DATA by performing predetermined signal processing on the image signal DATA0 and output this image signal DATA.

Next, the implementation of the imaging device 1 is described. In the imaging device 1, the respective blocks illustrated in FIG. 1 may be formed, for example, on one semiconductor substrate or a plurality of semiconductor substrates.

FIG. 8 illustrates an implementation example of the imaging device 1 in a case where the imaging device 1 is formed on two semiconductor substrates. In this example, the imaging device 1 is formed on two semiconductor substrates 101 and 102. For example, the pixel array 9 is formed on the semiconductor substrate 101 and the driving unit 10, the readout unit 20, the imaging controller 30, and the signal processor 40 are formed on the semiconductor substrate 102. The semiconductor substrates 101 and 102 are placed on each other. For example, the signal line VSL formed on the semiconductor substrate 101 is then electrically coupled to the connector CON and the AD converter ADC formed on the semiconductor substrate 102 through vias 103.

FIG. 9 illustrates an example of the disposition of circuits on the semiconductor substrates 101 and 102.

The pixel array 9 is formed on the semiconductor substrate 101. That is, the plurality of pixels P, the plurality of transfer control lines TGL, the plurality of reset control lines RSTL, the plurality of selection control lines SELL, and the plurality of signal lines VSL are formed on the semiconductor substrate 101. In addition, the semiconductor substrate 101 is provided with electrode regions 101A and 101B. A plurality of electrodes is formed in the electrode regions 101A and 101B. The plurality of these electrodes is coupled to the plurality of transfer control lines TGL, the plurality of reset control lines RSTL, the plurality of selection control lines SELL, and the plurality of signal lines VSL, for example, through TSVs (Through Silicon Vias).

The connector CON and a peripheral circuit portion 104 are formed on the semiconductor substrate 102. Here, the peripheral circuit portion 104 corresponds to the driving unit 10, the circuits other than the plurality of connectors CON in the readout unit 20, the imaging controller 30, and the signal processor 40. In addition, the semiconductor substrate 102 is provided with electrode regions 102A and 102B. A plurality of electrodes is formed in the electrode regions 102A and 102B. The plurality of these electrodes is coupled to the driving unit 10 and the readout unit 20, for example, through TSVs.

In the imaging device 1, the semiconductor substrate 101 and the semiconductor substrate 102 are placed on each other. This electrically couples the plurality of electrodes in the electrode region 101A on the semiconductor substrate 101 to the plurality of electrodes in the electrode region 102A on the semiconductor substrate 102 through the vias 103 and electrically couples the plurality of electrodes in the electrode region 101B on the semiconductor substrate 101 to the plurality of electrodes in the electrode region 102B on the semiconductor substrate 102 through the vias 103. As a result, the plurality of transfer control lines TGL, the plurality of reset control lines RSTL, and the plurality of selection control lines SELL formed on the semiconductor substrate 101 are coupled to the driving unit 10 formed on the semiconductor substrate 102 and the plurality of signal lines VSL formed on the semiconductor substrate 101 is coupled to the readout unit 20 formed on the semiconductor substrate 102.

In this way, disposing the pixel array 9 primarily on the semiconductor substrate 101 makes it possible to manufacture the semiconductor substrate 101 in the imaging device 1 by using a semiconductor manufacturing process specialized in forming pixels. That is, the semiconductor substrate 101 includes no circuit but the pixel array 9. For example, even the use of a special manufacturing process for forming pixels thus has no influence on a circuit other than the pixel array 9. In this way, it is possible to use a semiconductor manufacturing process specialized in forming pixels in the imaging device 1. This makes it possible to increase the imaging characteristics of the imaging device 1.

In addition, the plurality of connectors CON is formed on the semiconductor substrate 102 in the imaging device 1. This makes it possible to decrease the number of circuits formed on the semiconductor substrate 101. As a result, it is possible to decrease the semiconductor substrates 101 and 102 in size.

Here, the pixel array 9 corresponds to a specific example of an "imaging unit" in the present disclosure. The plurality of connectors CON each corresponds to a specific example of a "connector" in the present disclosure. The connection line CONL corresponds to a specific example of a "connection line" in the present disclosure. The transistor 79 corresponds to specific examples of a "first connection switch" and a "second connection switch" in the present disclosure. The control circuit 70 corresponds to specific examples of a "first control circuit" and a "second control circuit" in the present disclosure. The plurality of AD converters ADC each corresponds to a specific example of a "converter" in the present disclosure. The AD converter ADC corresponds to specific examples of a "first conversion circuit" and a "second conversion circuit" in the present disclosure. The P-phase period TP and the D-phase period TD each correspond to a specific example of a "conversion period" in the present disclosure. The period in which the control signal VSLCNT is brought to the high level corresponds to a specific example of a "preparation period" in the present disclosure. The reset voltage Vreset corresponds to specific examples of a "first initial voltage" and a "second initial voltage" in the present disclosure. The pixel voltage Vpix corresponds to specific examples of a "first pixel voltage" and a "second pixel voltage" in the present disclosure. The threshold voltage SIGTH corresponds to an example of a "threshold voltage" in the present disclosure. The capacitor 21 corresponds to a specific example of a "first capacitor" in the present disclosure. The capacitor 22 corresponds to a specific example of a "second capacitor" in the present disclosure. The comparator 24 corresponds to a specific example of a "comparison circuit" in the present disclosure. The transistor 61 corresponds to a specific example of a "first transistor" in the present disclosure. The transistor 62 corresponds to a specific example of a "second transistor" in the present disclosure. The transistor 64 corresponds to a specific example of a "first switch" in the present disclosure. The transistor 65 corresponds to a specific example of a "second switch" in the present disclosure.

[Operations and Workings]

Next, the operations and workings of the imaging device 1 according to the present embodiment are described.

(Overview of Overall Operation)

First, an overview of the overall operation of the imaging device 1 is described with reference to FIGS. 1 and 3. The driving unit 10 subsequentially drives the pixels P in the pixel array 9 in units of the pixel lines L. The pixel P outputs the reset voltage Vreset in the P-phase period TP and outputs the pixel voltage Vpix corresponding to the amount of received light in the D-phase period TD. In the readout unit 20, the connector CON couples the signal line VSL to the connection line CONL in accordance with the voltage of the signal SIG. The AD converter ADC performs AD conversion on the basis of each of the reset voltage Vreset and the pixel voltage Vpix and generates the digital code CODE. The readout unit 20 generates the image signal DATA0 on the basis of this digital code CODE. The signal processor 40 generates the image signal DATA by performing predetermined signal processing on the image signal DATA0 and outputs this image signal DATA.

(Detailed Operation)

In the imaging device 1, each of the pixels P in the pixel array 9 accumulates electric charges in accordance with the amount of received light and outputs the reset voltage Vreset and the pixel voltage Vpix as the signals SIG. The following describes this operation in detail.

FIG. 10 illustrates an example of an operation of scanning the plurality of pixels P in the pixel array 9. FIGS. 11A, 11B, 11C, 11D, 11E, 11F, 11G, 11H, 11I, and 11J illustrate an operation example of the imaging device 1. FIG. 11A indicates the waveform of a horizontal synchronization signal XHS, FIG. 11B indicates the waveform of a reset control signal SRST(0) for the 0th pixel line L, FIG. 11C indicates the waveform of a transfer control signal STG(0) for the 0th pixel line L, FIG. 11D indicates the waveform of a selection control signal SSEL(0) for the 0th pixel line L, FIG. 11E indicates the waveform of a reset control signal SRST(1) for the first pixel line L, FIG. 11F indicates the waveform of a transfer control signal STG(1) for the first pixel line L, FIG. 11G indicates the waveform of a selection control signal SSEL(1) for the first pixel line L, FIG. 11H indicates the waveform of a reset control signal SRST(2) for the second pixel line L, FIG. 11I indicates the waveform of a transfer control signal STG(2) for the second pixel line L, and FIG. 11J indicates the waveform of a selection control signal SSEL(2) for the second pixel line L.

As illustrated in FIG. 10, the imaging device 1 performs accumulation start driving D1 on the plurality of pixels P in the pixel array 9 in order from top in the vertical direction in the period from a timing t0 to a timing t1. Specifically, as illustrated in FIGS. 11A, 11B, 11C, 11D, 11E, 11F, 11G, 11H, 11I, and 11J, the driving unit 10 sets on the transistors TG and RST, for example, in order from top in the vertical direction in units of the pixel lines L in a predetermined period within a horizontal period H. This causes the plurality of respective pixels P to accumulate electric charges in an accumulation period T10 before readout driving D2 is performed.

As illustrated in FIG. 10, the imaging device 1 then performs the readout driving D2 on the plurality of pixels P in order from top in the vertical direction in the period from a timing t10 to a timing t11. Specifically, as illustrated in FIGS. 11A, 11B 11C, 11D, 11E, 11F, 11G, 11H, 11I, and 11J, the driving unit 10 controls the operations of the transistors TG, RST, and SEL, for example, in order from top in the vertical direction in units of the pixel lines L. This causes each of the plurality of pixels P to sequentially output the reset voltage Vreset and the pixel voltage Vpix. The readout unit 20 performs AD conversion on the basis of each of these reset voltage Vreset and pixel voltage Vpix and generates the digital code CODE.

The imaging device 1 repeats the accumulation start driving D1 and the readout driving D2 like these. Specifically, as illustrated in FIG. 10, the imaging device 1 performs the accumulation start driving D1 in the period from a timing t2 to a timing t3 and performs the readout driving D2 in the period from a timing t12 to a timing t13. In addition, the imaging device 1 performs the accumulation start driving D1 in the period from a timing t4 to a timing t5 and performs the readout driving D2 in the period from a timing t14 to a timing t15.

(Regarding Readout Driving D2)

Next, the readout driving D2 is described in detail. The following focuses on a certain pixel PA of the plurality of pixels P and describes an operation related to this pixel PA in detail.

FIGS. 12A, 12B, 12C, 12D, 12E, 12F, 12G, 12H, and 12I illustrate an operation example of the readout driving D2 in the pixel PA of interest. FIG. 12A indicates the waveform of the horizontal synchronization signal XHS, FIG. 12B indicates the waveform of the reset control signal SRST, FIG. 12C indicates the waveform of the transfer control signal STG, FIG. 12D indicates the waveform of the selection control signal SSEL, FIG. 12E indicates the waveform of the reference signal REF, FIG. 12F indicates the waveform of the signal SIG, FIG. 12G indicates the waveform of the signal CMP outputted from the comparator 24 of the AD converter ADC, FIG. 12H indicates the waveform of the clock signal CLK, and FIG. 12I indicates the count value CNT in the counter 25 of the AD converter ADC. FIGS. 12E and 12F indicate the waveforms of the reference signal REF and the signal SIG by using the same voltage axis. Here, the reference signal REF in FIG. 12E indicates the waveform at the positive input terminal of the comparator 24 and the signal SIG in FIG. 12F indicates the waveform at the negative input terminal of the comparator 24.

In the imaging device 1, in a certain horizontal period (H), first, the driving unit 10 performs a reset operation on the pixel PA and the AD converter ADC performs AD conversion on the basis of the reset voltage Vreset outputted from the pixel PA in the following P-phase period TP. The driving unit 10 then performs an electric charge transfer operation on the pixel PA and the AD converter ADC performs AD conversion on the basis of the pixel voltage Vpix outputted from the pixel PA in the D-phase period TD. The following describes this operation in detail.

First, the horizontal period H starts at a timing t21 and the driving unit 10 then changes the voltage of the selection control signal SSEL from the low level to the high level at a timing t22 (FIG. 12D). This turns on the transistor SEL in the pixel PA. The pixel PA is electrically coupled to the signal line VSL.

Next, the driving unit 10 changes the voltage of the reset control signal SRST from the low level to the high level at a timing t23 (FIG. 12B). This turns on the transistor RST in the pixel PA. The voltage of the floating diffusion FD is set at the power supply voltage VDD (reset operation).

Next, the driving unit 10 changes the voltage of the reset control signal SRST from the high level to the low level at a timing t24 (FIG. 12B). This turns off the transistor RST in the pixel PA. As described below, the comparator 24 then performs a zero adjustment of setting voltage values in the capacitors 21 and 22 in the period from the timing t24 to a timing t25 and the connector CON couples the signal line VSL to the connection line CONL in accordance with the voltage of the signal SIG.

Next, the reference signal generator 31 changes the voltage of the reference signal REF to a voltage V1 at the timing t25 (FIG. 12E).

This turns on the transistor SEL and turns off each of the transistors TG and RST in the pixel PA. The floating diffusion FD retains the electric charges at the time of resetting the floating diffusion FD in the period from the timing t23 to the timing t24. The pixel PA outputs the reset voltage Vreset corresponding to the voltage in the floating diffusion FD at this time.

Next, the readout unit 20 performs AD conversion on the basis of this reset voltage Vreset in the period (P-phase period TP) from a timing t26 to a timing t28. Specifically, the imaging controller 30 first starts to generate the clock signal CLK at the timing t26 (FIG. 12H). At the same time as this, the reference signal generator 31 starts to decrease the voltage of the reference signal REF from the voltage V1 by a predetermined degree of change (FIG. 12E). Accordingly, the counter 25 of the AD converter ADC starts a counting operation to sequentially change the count value CNT (FIG. 12I).

The voltage of the reference signal REF then falls below the reset voltage Vreset at a timing t27 (FIGS. 12E and 12F). Accordingly, the comparator 24 of the AD converter ADC changes the voltage of the signal CMP from the high level to the low level (FIG. 12G). As a result, the counter 25 stops the counting operation (FIG. 12I).

Next, the imaging controller 30 stops generating the clock signal CLK at the end of the P-phase period TP at the timing t28 (FIG. 12H). At the same time as this, the reference signal generator 31 stops changing the voltage of the reference signal REF and changes the voltage of the reference signal REF to the voltage V1 at the following timing t29 (FIG. 12E). Accordingly, the voltage of the reference signal REF exceeds the reset voltage Vreset (FIGS. 12E and 12F). The comparator 24 of the AD converter ADC thus changes the voltage of the signal CMP from the low level to the high level (FIG. 12G).

Next, the counter 25 of the AD converter ADC inverses the polarity of the count value CNT on the basis of the control signal CC at a timing t30 (FIG. 12I).

Next, the driving unit 10 changes the voltage of the transfer control signal STG from the low level to the high level at a timing t31 (FIG. 12C). This turns on the transistor TG in the pixel PA. As a result, the electric charges generated in the photodiode PD are transferred to the floating diffusion FD (electric charge transfer operation). The voltage of the signal SIG decreases in accordance with this (FIG. 12F).

The driving unit 10 then changes the voltage of the transfer control signal STG from the high level to the low level at a timing t32 (FIG. 12C). This turns off the transistor TG in the pixel PA.

This turns on the transistor SEL and turns off each of the transistors TG and RST in the pixel PA. The floating diffusion FD retains the electric charges transferred from the photodiode PD in the period from the timing t31 to the timing t32. The pixel PA outputs the pixel voltage Vpix corresponding to the voltage in the floating diffusion FD at this time.

Next, the readout unit 20 performs AD conversion on the basis of the pixel voltage Vpix in the period (D-phase period TD) from a timing t33 to a timing t35. Specifically, the imaging controller 30 first starts to generate the clock signal CLK at the timing t33 (FIG. 12H). At the same time as this, the reference signal generator 31 starts to decrease the voltage of the reference signal REF from the voltage V1 by a predetermined degree of change (FIG. 12E). Accordingly, the counter 25 of the AD converter ADC starts a counting operation to sequentially change the count value CNT (FIG. 12I).

The voltage of the reference signal REF then falls below the pixel voltage Vpix at a timing t34 (FIGS. 12E and 12F). Accordingly, the comparator 24 of the AD converter ADC changes the voltage of the signal CMP from the high level to the low level (FIG. 12G). As a result, the counter 25 stops the counting operation (FIG. 12I). In this way, the AD converter ADC obtains the count value CNT corresponding to the difference between the reset voltage Vreset and the pixel voltage Vpix. The latch in the output stage of the counter 25 then makes this count value CNT latch and outputs the count value CNT made to latch as the digital code CODE.

Next, the imaging controller 30 stops generating the clock signal CLK at the end of the D-phase period TD at the timing t35 (FIG. 12H). At the same time as this, the reference signal generator 31 stops changing the voltage of the reference signal REF and changes the voltage of the reference signal REF to a voltage V2 at the following timing t36 (FIG. 12E). Accordingly, the voltage of the reference signal REF exceeds the pixel voltage Vpix (FIGS. 12E and 12F). The comparator 24 of the AD converter ADC thus changes the voltage of the signal CMP from the low level to the high level (FIG. 12G).

Next, the driving unit 10 changes the voltage of the selection control signal SSEL from the high level to the low level at a timing t37 (FIG. 12D). This turns off the transistor SEL in the pixel PA. The pixel PA is electrically uncoupled from the signal line VSL.

The counter 25 of the AD converter ADC then resets the count value CNT as "0" on the basis of the control signal CC at a timing t38 (FIG. 12I).

In this way, in the imaging device 1, the counting operation is performed on the basis of the reset voltage Vreset in the P-phase period TP. After the polarity of the count value CTN is inversed, the counting operation is performed on the basis of the pixel voltage Vpix in the D-phase period TD. This allows the imaging device 1 to acquire the digital code CODE corresponding to the voltage difference between the reset voltage Vreset and the pixel voltage Vpix. In the imaging device 1, such correlated double sampling is performed. It is thus possible to remove the noise component included in the pixel voltage Vpix. As a result, it is possible to increase the image quality of a captured image.

(Operation of Connector CON)

Next, the operation of the connector CON is described in detail. As illustrated in FIG. 13, the following focuses on two certain signal lines VSL (signal lines VSL[M] and VSL[N]) of the plurality of signal lines VSL. A pixel P[M] is coupled to the signal line VSL[M] and the pixel P[N] is coupled to the signal line VSL[N]. These pixels P[M] and P[N] belong to the same pixel line L. The signal line VSL[M] transmits a signal SIG[M] and the signal line VSL[N] transmits a signal SIG[N]. A connector CON[M] and an AD converter ADC[M] are coupled to the signal line VSL[M] and a connector CON[N] and an AD converter ADC[N] are coupled to the signal line VSL[N].

FIGS. 14A, 14B, 14C, 14D, 14E, 14F, 14G, 14H, and 14I illustrate an operation example of the connector CON. FIG. 14A indicates the waveform of the reset control signal SRST for each of the pixels P[M] and P[N], FIG. 14B indicates the waveform of the transfer control signal STG for each of the pixels P[M] and P[N], FIG. 14C indicates the waveform of the selection control signal SSEL for each of the pixels P[M] and P[N], FIG. 14D indicates the waveform of the control signal PSET, FIG. 14E indicates the waveform of the control signal VSLCNT, FIG. 14F indicates the waveform of the signal SIG[M], FIG. 14G indicates the waveform of the signal SIG[N], FIG. 14H indicates the waveform of a signal (signal SN[M]) at the negative input terminal of the comparator 24 in the AD converter ADC[M], and FIG. 14I indicates the waveform of a signal (signal SN[N]) at the negative input terminal of the comparator 24 in the AD converter ADC[N]. FIGS. 14F and 14G indicate the waveforms of the signals SIG[M] and SIG[N] by using the same voltage axis and FIGS. 14H and 14I indicate the waveforms of the signals SN[M] and SN[N] by using the voltage axis. In this example, the pixels P[M] and P[N] hardly detect light. Each of the pixels P[M] and P[N] thus outputs the pixel voltage Vpix that is substantially equal to the reset voltage Vreset.

First, the driving unit 10 changes the voltage of the selection control signal SSEL from the low level to the high level at a timing t41 (FIG. 14C). This turns on the transistor SEL in each of the pixels P[M] and P[N], the pixel P[M] is electrically coupled to the signal line VSL[M], and the pixel P[N] is electrically coupled to the signal line VSL[N].

Next, the driving unit 10 changes the voltage of the reset control signal SRST from the low level to the high level at a timing t42 (FIG. 14A). This turns on the transistor RST in each of the pixels P[M] and P[N]. The voltage of the floating diffusion FD is set at the power supply voltage VDD (reset operation). As a result, the signals SIG[M] and SIG[N] increase (FIGS. 14F and 14G). In this example, the signals SIG[M] and SIG[N] have different voltages, for example, because of a variation in the characteristics of the transistor AMP. Specifically, in this example, the voltage of the signal SIG[M] is higher than the voltage of the signal SIG[N].

At the same time as this, the imaging controller 30 changes the voltage of the control signal PSET from the high level to the low level (FIG. 14D). This turns on the transistors 64 and 65 (FIG. 7) of the comparator 24 in each of the AD converters ADC[M] and ADC[N]. The voltages (voltages of the signals SN[M] and SN[N]) at the negative input terminals of these comparators 24 then increase (FIGS. 14H and 14I).

Next, the driving unit 10 changes the voltage of the reset control signal SRST from the high level to the low level at a timing t43 (FIG. 14A). This turns off the transistor RST in each of the pixels P[M] and P[N]. This reset control signal SRST is then transmitted to the floating diffusion FD via the parasitic capacitance of the transistor RST, thereby decreasing the signals SIG[M] and SIG[N] (FIGS. 14F and 14G). At this time, the voltage of the signal SIG[M] is higher than the voltage of the signal SIG[N] by a voltage difference ΔV. In this example, the signals SN[M] and SN[N] then decrease (FIGS. 14H and 14I).

Next, the imaging controller 30 changes the voltage of the control signal VSLCNT from the low level to the high level at a timing t44 (FIG. 14E). This causes the connector CON[M] to couple the signal line VSL[M] to the connection line CONL and causes the connector CON[N] to couple the signal line VSL[N] to the connection line CONL. That is, the voltage of the signal SIG[M] is higher than the threshold voltage SIGTH. In the connector CON[M], the transistor 79 is thus turned on on the basis of the control signal VSLCNT and the signal line VSL[M] is coupled to the connection line CONL. Similarly, the voltage of the signal SIG[N] is higher than the threshold voltage SIGTH. In the connector CON[N], the transistor 79 is thus turned on on the basis of the control signal VSLCNT and the signal line VSL[N] is coupled to the connection line CONL. This couples the signal line VSL[M] and the signal line VSL[N] to each other via the connection line CONL. Accordingly, the voltage of the signal SIG[M] decreases and the voltage of the signal SIG[N] increases. This causes the voltages of the signals SIG[M] and SIG[N] to be equal to each other (FIGS. 14F and 14G). At this time, the voltages of the signals SN[M] and SN[N] are retained (FIGS. 14H and 14I). In this way, a zero adjustment is performed in the AD converter ADC[M] and the voltages of the capacitors 21 and 21 are set. Similarly, a zero adjustment is performed in the AD converter ADC[N] and the voltages of the capacitors 21 and 21 are set.

Next, the imaging controller 30 changes the voltage of the control signal VSLCNT from the high level to the low level at a timing t45 (FIG. 14E). This causes the connector CON[M] to uncouple the signal line VSL[M] from the connection line CONL and causes the connector CON[N] to uncouple the signal line VSL[N] from the connection line CONL. This causes the voltages of the signals SIG[M] and SIG[N] to each return to the voltage immediately before the timing t44 (FIGS. 14F and 14G). As a result, the voltage of the signal SIG[M] and the voltage of the signal SIG[N] have the voltage difference ΔV as seen immediately before the timing t44. Each of the voltages of these signals SIG[M] and SIG[N] is the reset voltage Vreset.

At the same time as this, the imaging controller 30 changes the voltage of the control signal PSET from the low level to the high level (FIG. 14D). This turns off the transistors 64 and 65 (FIG. 7) of the comparator 24 in each of the AD converters ADC[M] and ADC[N]. This brings the gate of the transistor 62 of the comparator 24 to a floating state and retains the voltage between both ends of the capacitor 22 thereafter. This increases the voltage of the signal SN[M] in accordance with a change in the voltage of the signal SIG[M] and increases the voltage of the signal SN[N] in accordance with a change in the voltage of the signal SIG[N] (FIGS. 14H and 14I). As a result, the voltage of the signal SN[M] and the voltage of the signal SN[N] have the voltage difference ΔV.

Afterward, the AD converter ADC[M] performs AD conversion on the basis of the reset voltage Vreset of the signal SIG[M] in the P-phase period TP and the AD converter ADC[N] performs AD conversion on the basis of the reset voltage Vreset of the signal SIG[N].

Next, the driving unit 10 changes the voltage of the transfer control signal STG from the low level to the high level at a timing t46 and the driving unit 10 changes the voltage of the transfer control signal STG from the high level to the low level at a timing t47 (FIG. 14B). Each of the voltages of the signals SIG[M] and SIG[N] is the pixel voltage Vpix thereafter (FIGS. 14F and 14G).

The AD converter ADC[M] then performs AD conversion on the basis of the pixel voltage Vpix of the signal SIG[M] in the D-phase period TD and the AD converter ADC[N] performs AD conversion on the basis of the pixel voltage Vpix of the signal SIG[N].

In this way, the AD converter ADC[M] generates the digital code CODE corresponding to the amount of received light in the pixel P[M] and the AD converter ADC[N] generates the digital code CODE corresponding to the amount of received light in the pixel P[N].

As described above, in the imaging device 1, it is possible to make the voltage (voltage of the signal SN[M]) at the negative input terminal of the comparator 24 in the AD converter ADC[M] different from the voltage (voltage of the signal SN[N]) at the negative input terminal of the comparator 24 in the AD converter ADC[M] as indicated in FIGS. 14H and 14I. The voltage difference ΔV between the voltage of this signal SN[M] and the voltage of this signal SN[N] is caused by a variation in the pixels P[M] and P[N]. This makes it possible to vary the voltages at the negative input terminals of the comparators 24 in the plurality of AD converters ADC in accordance with a variation in the plurality of pixels P in the selected pixel line L. This changes the voltage at the negative input terminal of the comparator 24 in each of the AD converters ADC in accordance with the selected pixel line L. As a result, it is possible in the imaging device 1 to reduce the risk of a captured image having a vertical streak.

That is, in a case where the pixels P for one column are coupled to one AD converter like the imaging device 1, a quantization error variation in the column direction (longitudinal direction) is smaller than a quantization error variation in the row direction (lateral direction). In short, one AD converter performs AD conversion in the column direction, resulting in a small quantization error variation. Different AD converters perform AD conversion in the row direction, resulting in a large quantization error variation. As a result, a captured image may have a vertical streak. The imaging device 1 is thus provided with the connector CON and couples the signal line VSL to the connection line CONL. This changes the voltage at the negative input terminal of the comparator 24 in each of the AD converters ADC in accordance with the selected pixel line L. As a result, it is possible in the imaging device 1 to make a larger quantization error variation in the column direction. It is thus possible to reduce the risk of a captured image having a vertical streak.

Next, the operation of the connector CON is described in detail with reference to another example. As illustrated in FIG. 15, the following focuses on three certain signal lines VSL (signal lines VSL[L], VSL[M], and VSL[N]) of the plurality of signal lines VSL. A pixel P[L] is coupled to the signal line VSL[L], the pixel P[M] is coupled to the signal line VSL[M], and the pixel P[N] is coupled to the signal line VSL[N]. These pixels P[L], P[M], and P[N] belong to the same pixel line L. The signal line VSL[L] transmits a signal SIG[L], the signal line VSL[M] transmits the signal SIG[M], and the signal line VSL[N] transmits the signal SIG[N]. A connector CON[L] and an AD converter ADC[L] are coupled to the signal line VSL[L], the connector CON[M] and the AD converter ADC[M] are coupled to the signal line VSL[M], and the connector CON[N] and the AD converter ADC[N] are coupled to the signal line VSL[N].

FIGS. 16A, 16B, 16C, 16D, 16E, and 16F illustrate an operation example of the connector CON. FIG. 16A indicates the waveform of the control signal PSET, FIG. 16B indicates the waveform of the control signal VSLCNT, FIG. 16C indicates the waveform of the reference signal REF, FIG. 16D indicates the waveform of the signal SIG[L], FIG. 16E indicates the waveform of the signal SIG[M], and FIG. 16F indicates the waveform of the signal SIG[N]. FIGS. 16C, 16D, 16E, and 16F indicate the waveforms of the reference signal REF and the signals SIG[L], SIG[M], and SIG[N] by using the same voltage axis. In this example, the pixels P[L] and P[N] each have a small amount of received light and the pixel P[M] has a large amount of received light.

The imaging controller 30 brings the voltage of the control signal PSET to the low level in a period before a timing t51 (FIG. 16A). This turns on the transistors 64 and 65 (FIG. 7) of the comparator 24 in each of the AD converters ADC[L], ADC[M], and ADC[N]. In this example, the signals SIG[L] and SIG[N] have different voltages, for example, because of a variation in the characteristics of the transistor AMP (FIGS. 16D and 16F). Specifically, in this example, the voltage of the signal SIG[L] is higher than the voltage of the signal SIG[N] by the voltage difference ΔV.

The imaging controller 30 then changes the voltage of the control signal VSLCNT from the low level to the high level at the timing t51 (FIG. 16B). The voltages of the signals SIG[L], SIG[M], and SIG[N] are higher than the threshold voltage SIGTH (FIGS. 16D, 16E, and 16F). Accordingly, the connector CON[L] couples the signal line VSL[L] to the connection line CONL, the connector CON[M] couples the signal line VSL[M] to the connection line CONL, and the connector CON[N] couples the signal line VSL[N] to the connection line CONL. The pixel P[M] has a large amount of received light and the voltage of the signal SIG[M] thus decreases gradually. The signal lines VSL[L], VSL[M], and VSL[N] are then coupled to each other via the connection line CONL and the voltages of the signals SIG[L] and SIG[N] thus decrease closer to the signal SIG[M].

The connector CON[M] then uncouples the signal line VSL[M] from the connection line CONL when the signal SIG[M] falls below the threshold voltage SIGTH at a timing t52. This uncouples the signal lines VSL[L] and VSL[N] from the signal line VSL[M] and the voltages of the signals SIG[L] and SIG[N] start to increase (FIGS. 16D and 16F). The signal line VSL[M] and the signal line VSL[N] are coupled to each other via the connection line CONL. This causes the voltage of the signal SIG[M] and the voltage of the signal SIG[N] to be equal to each other.

Next, the imaging controller 30 changes the voltage of the control signal VSLCNT from the high level to the low level and changes the voltage of the control signal PSET from the low level to the high level at a timing t53 (FIGS. 16A and 16B). This causes the connector CON[L] to uncouple the signal line VSL[L] from the connection line CONL and causes the connector CON[N] to uncouple the signal line VSL[N] from the connection line CONL. As a result, the voltage of the signal SIG[L] and the voltage of the signal SIG[N] have the voltage difference ΔV as seen immediately before the timing t51 (FIGS. 16D and 16F).

Next, the reference signal generator 31 changes the voltage of the reference signal REF to the voltage V1 at a timing t54 and decreases the voltage of the reference signal REF from the voltage V1 by a predetermined degree of change in the period (P-phase period TP) from a timing t55 to a timing t56 (FIG. 16C). The AD converter ADC[L] then performs AD conversion on the basis of the reset voltage Vreset of the signal SIG[L] and the AD converter ADC[N] performs AD conversion on the basis of the reset voltage Vreset of the signal SIG[N].

The reference signal generator 31 then changes the voltage of the reference signal REF to the voltage V1 at a timing t57 and decreases the voltage of the reference signal REF from the voltage V1 by a predetermined degree of change in the period (D-phase period TD) from a timing t58 to a timing t59 (FIG. 16C). The AD converter ADC[L] then performs AD conversion on the basis of the pixel voltage Vpix of the signal SIG[L] and the AD converter ADC[N] performs AD conversion on the basis of the pixel voltage Vpix of the signal SIG[N].

In this way, in the imaging device 1, the connector CON[M] uncouples the signal line VSL[M] from the connection line CONL when the voltage of the signal SIG[M] falls below the threshold voltage SIGTH. This makes it possible to reduce the risk that a value (pixel value) indicated by the obtained digital code CODE decreases and increase the image quality as described below with reference to a comparative example.

Comparative Example

Next, an imaging device 1R according to a comparative example is described. The imaging device 1R includes the pixel array 9, the driving unit 10, a readout unit 20R, an imaging controller 30R, and the signal processor 40.

FIG. 17 illustrates a configuration example of the readout unit 20R. The readout unit 20R includes a plurality of connectors CONR. Each of the plurality of connectors CONR includes the transistor 79. The transistor 79 has the gate supplied with the control voltage VSLCNT from the imaging controller 30R. That is, the readout unit 20R is configured by removing the control circuit 70 from the readout unit 20 according to the present embodiment. This configuration causes the connector CONR to couple the signal line VSL to the connection line CONL in the period in which the voltage of the control signal VSLCNT is in the high level.

The imaging controller 30R is configured to control the operation of the imaging device 1 by supplying control signals to the driving unit 10, the readout unit 20R, and the signal processor 40 and controlling the operations of these circuits. The imaging controller 30R performs control to cause the readout unit 20R to generate the image signal DATA0 on the basis of the signal SIG by supplying the readout unit 20R with the reference signal REF, the clock signal CLK, the control signals VSLCNT, PSET, and CC, and the control signals SSW (control signals SSW[0], SSW[1], SSW[2], . . . ).

FIGS. 18A, 18B, 18C, 18D, 18E, and 18F illustrates an operation example of the connector CONR. FIG. 18A indicates the waveform of the control signal PSET, FIG. 18B indicates the waveform of the control signal VSLCNT, FIG. 18C indicates the waveform of the reference signal REF, FIG. 18D indicates the waveform of the signal SIG[L], FIG. 18E indicates the waveform of the signal SIG[M], and FIG. 18F indicates the waveform of the signal SIG[N]. FIGS. 18C, 18D, 18E, and 18F indicate the waveforms of the reference signal REF and the signals SIG[L], SIG[M], and SIG[N] by using the same voltage axis. In this example, the pixels P[L] and P[N] each have a small amount of received light and the pixel P[M] has a large amount of received light.

The imaging controller 30R brings the voltage of the control signal PSET to the low level in a period before a timing t61 (FIG. 18A). This turns on the transistors 64 and 65 (FIG. 7) of the comparator 24 in each of the AD converters ADC[L], ADC[M], and ADC[N].

The imaging controller 30R then changes the voltage of the control signal VSLCNT from the low level to the high level at the timing t61 (FIG. 18B). The voltages of the signals SIG[L], SIG[M], and SIG[N] are higher than the threshold voltage SIGTH (FIGS. 18D, 18E, and 18F). Accordingly, a connector CONR[L] couples the signal line VSL[L] to the connection line CONL, a connector CONR [M] couples the signal line VSL[M] to the connection line CONL, and a connector CONR[N] couples the signal line VSL[N] to the connection line CONL. The signal lines VSL[L], VSL[M], and VSL[N] are coupled to each other via the connection line CONL and the voltages of the signals SIG[L] and SIG[N] thus decrease closer to the signal SIG[M] (FIGS. 18D, 18E, and 18F). The voltages of the signals SIG[M] and SIG[N] are then equal to each other at a timing t62.

Next, the imaging controller 30R changes the voltage of the control signal VSLCNT from the high level to the low level and changes the voltage of the control signal PSET from the low level to the high level at a timing t63 (FIGS. 18A and 18B). This causes the connector CONR[L] to uncouple the signal line VSL[L] from the connection line CONL, causes the connector CONR[M] to uncouple the signal line VSL[M] from the connection line CONL, and causes the connector CONR[N] to uncouple the signal line VSL[N] from the connection line CONL. As a result, each of the voltages of the signals SIG[L] and SIG[N] is changed toward the voltage immediately before the timing t61.

In this example, the voltage of the signal SIG[L] returns to the voltage immediately before the timing t61 at a timing t64 (FIG. 18D). The voltage of this signal SIG[L] is higher than the voltage V1 of the reference signal REF. This prevents the voltage (reset voltage Vreset) of this signal SIG[L] from intersecting the reference signal REF in the period (P-phase period TP) from a timing t65 to a timing t68. That is, the voltage of this signal SIG[L] exceeds a voltage range within which the AD converter ADC[L] is operable in this P-phase period TP. This prevents the AD converter ADC[L] from normally performing AD conversion in this P-phase period TP. Specifically, the voltage of the reference signal REF is lower than the voltage (reset voltage Vreset) of the signal SIG[L] at the timing t65 at which the P-phase period TP starts. The counter 25 in this AD converter ADC[L] does not thus start a counting operation and the count value CNT becomes "0". As a result, the pixel value indicated by the digital code CODE is lower than a desired pixel value. The digital code CODE is obtained by the AD converter ADC[L] performing AD conversion in the P-phase period TP and the D-phase period TD.

In addition, in this example, the voltage of the signal SIG[N] returns to the voltage immediately before the timing t61 at the timing t67 after the P-phase period TP starts at the timing t65 (FIG. 18F). That is, in this example, the voltage of the signal SIG[N] is to be widely changed at and after the timing t63. It thus takes time for settling. This causes the voltage of this signal SIG[N] to intersect the reference signal REF at the timing t66 at which the voltage is being changed in the period (P-phase period TP) from the timing t65 to the timing t68. This prevents the AD converter ADC[N] from normally performing AD conversion in this P-phase period TP. Specifically, the count value CNT of the counter 25 in this AD converter ADC[N] becomes the count value corresponding to this timing t66 and larger than a desired count value. As a result, the pixel value indicated by the digital code CODE is lower than a desired pixel value. The digital code CODE is obtained by the AD converter ADC[N] performing AD conversion in the P-phase period TP and the D-phase period TD.

In this way, in the imaging device 1R, the AD converter ADC may fail to normally perform AD conversion in the P-phase period TP. As a result, the obtained digital code CODE indicates a low value (pixel value).

In contrast, the imaging device 1 according to the present embodiment uncouples the signal line VSL[M] from the connection line CONL in a case where the voltage of the signal SIG[M] is lower than the threshold voltage SIGTH. This makes it possible to reduce the risk that the voltages of the signals SIG[L] and SIG[N] are too low as indicated in the timing t52 to the timing t53 in FIGS. 16A, 16B, 16C, 16D, 16E, and 16F. It is thus possible to have each of the voltages of the signals SIG[L] and SIG[N] return to the original voltage in a short time at and after the timing t53. This allows the AD converter ADC to normally perform AD conversion in the P-phase period TP. As a result, it is possible in the imaging device 1 to obtain the desired digital code CODE by performing AD conversion and it is thus possible to increase the image quality.

[Effects]

As described above, in the present embodiment, a signal line is uncoupled from a connection line in a case where the voltage of the signal SIG is lower than the threshold voltage SIGTH. This makes it possible to increase the image quality.

2. Usage Example of Imaging Device

FIG. 19 illustrates a usage example of the imaging device 1 according to the above-described embodiment. For example, the above-described imaging device 1 is usable in a variety of cases of sensing light such as visible light, infrared light, ultraviolet light, and X-ray as follows.

Devices that shoot images for viewing such as digital cameras and mobile devices having a camera function
Devices for traffic use such as onboard sensors that shoot images of the front, back, surroundings, inside, and so on of an automobile for safe driving such as automatic stop and for recognition of a driver's state, monitoring cameras that monitor traveling vehicles and roads, and distance measuring sensors that measure vehicle-to-vehicle distance
Devices for use in home electrical appliances such as televisions, refrigerators, and air-conditioners to shoot images of a user's gesture and bring the appliances into operation in accordance with the gesture
Devices for medical care and health care use such as endoscopes and devices that shoot images of blood vessels by receiving infrared light
Devices for security use such as monitoring cameras for crime prevention and cameras for individual authentication
Devices for beauty use such as skin measuring devices that shoot images of skin and microscopes that shoot images of scalp
Devices for sports use such as action cameras and wearable cameras for sports applications and the like
Devices for agricultural use such as cameras for monitoring the states of fields and crops 3. Example of Application to Mobile Body The technology (the present technology) according to the present disclosure is applicable to a variety of products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, or a robot.

FIG. 20 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 20, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 1021, an audio speaker 12061, a display section 12062, and an instrument panel 12063 are illustrated as the output device. The display section 12062 may, for example, include at least one of an on-board display and a head-up display.

FIG. 21 is a diagram depicting an example of the installation position of the imaging section 12031.

In FIG. 21, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 21 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The above has described the example of the vehicle control system to which the technology according to the present disclosure may be applied. The technology according to the present disclosure may be applied to the imaging section 12031 among the above-described components. This makes it possible in the vehicle control system 12000 to increase the image quality of a captured image. As a result, the vehicle control system 12000 allows for an increase in the accuracy of a collision avoidance or collision mitigation function for the vehicle, a following driving function based on vehicle-to-vehicle distance, a vehicle speed maintaining driving function, a warning function of collision of the vehicle, a warning function of deviation of the vehicle from a lane, and the like.

Although the above has described the present technology with reference to the embodiment and specific application examples thereof, the present technology is not limited to these embodiment or the like. The present technology may be modified in a variety of ways.

For example, in the above-described embodiment, the plurality of connectors CON is formed on the semiconductor substrate 102 as illustrated in FIG. 9. It is not, however, limitative. Instead of this, the plurality of connectors CON may be formed on the semiconductor substrate 101, for example, like an imaging device 1A illustrated in FIG. 21.

In addition, for example, the configuration of pixels, the configuration of the control circuit 70, the configuration of the AD converter ADC, and the like in the above-described embodiment and the like are examples and may be changed as required.

It is to be noted that the effects described in the present specification are merely illustrative, but not limited. In addition, other effects may be included.

It is to be noted that the present technology may be configured as below.

(1) An imaging device including:
an imaging unit including a first signal line, a first pixel, a second signal line, and a second pixel, the first pixel being configured to output a first pixel voltage to the first signal line, the first pixel voltage corresponding to an amount of received light, the second pixel being configured to output a second pixel voltage to the second signal line, the second pixel voltage corresponding to the amount of received light;
a connector including a connection line, a first connection switch, a first control circuit, a second connection switch, and a second control circuit, the first connection switch being configured to couple the first signal line to the connection line by being turned on, the first control circuit being configured to control an operation of the first connection switch on the basis of a voltage in the first signal line, the second connection switch being configured to couple the second signal line to the connection line by being turned on, the second control circuit being configured to control an operation of the second connection switch on the basis of a voltage in the second signal line; and
a converter that is coupled to the first signal line and the second signal line, the converter being configured to perform AD conversion on the basis of each of the first pixel voltage and the second pixel voltage.

(2) The imaging device according to (1), in which
the converter is configured to perform the AD conversion in a conversion period,
the first control circuit is configured to turn on or off the operation of the first connection switch in a preparation period before the conversion period on the basis of whether or not the voltage in the first signal line is greater than a threshold voltage, and
the second control circuit is configured to turn on or off the operation of the second connection switch in the preparation period on the basis of whether or not the voltage in the second signal line is greater than the threshold voltage.

(3) The imaging device according to (2), in which the threshold voltage is configured to be changed.

(4) The imaging device according to (2) or (3), in which
the conversion period includes a first period and a second period after the first period,
the first pixel is configured to output a first initial voltage to the first signal line in the first period and is configured to output the first pixel voltage to the first signal line in the second period,
the second pixel is configured to output a second initial voltage to the second signal line in the first period and is configured to output the second pixel voltage to the second signal line in the second period, and
the converter includes a first conversion circuit and a second conversion circuit, the first conversion circuit being configured to perform the AD conversion on the basis of the first initial voltage and the first pixel voltage, the second conversion circuit being configured to perform the AD conversion on the basis of the second initial voltage and the second pixel voltage.

(5) The imaging device according to (4), further including a reference signal generator configured to generate a reference signal whose voltage changes with lapse of time in the first period and the second period, in which the first conversion circuit is configured to perform the AD conversion on the basis of a result of comparison between the first initial voltage and the first pixel voltage and the reference signal, and the second conversion circuit is configured to perform the AD conversion on the basis of a result of comparison between the second initial voltage and the second pixel voltage and the reference signal.

(6) The imaging device according to (5), in which
the first conversion circuit includes
a first capacitor including a first terminal and a second terminal, the first terminal being supplied with the reference signal,
a second capacitor including a first terminal and a second terminal, the first terminal being coupled to the first signal line, and
a comparison circuit configured to compare a voltage at the second terminal of the first capacitor and a voltage at the second terminal of the second capacitor, and
the first conversion circuit is configured to set a voltage of the second capacitor in the preparation period.

(7) The imaging device according to (6), in which
the comparison circuit includes
a first transistor including a gate, a source, and a drain, the gate being coupled to the second terminal of the first capacitor,
a second transistor including a gate, a source, and a drain, the gate being coupled to the second terminal of the second capacitor, the source being coupled to the source of the first transistor,
a first switch configured to couple the gate of the first transistor and the drain of the first transistor in the preparation period, and
a second switch configured to couple the gate of the second transistor and the drain of the second transistor in the preparation period.

(8) The imaging device according to any of (1) to (7), in which
the first signal line, the second signal line, the first pixel, and the second pixel are formed on a first semiconductor substrate, and
the connector and the converter are formed on a second semiconductor substrate, the second semiconductor substrate being placed on the first semiconductor substrate.

This application claims the priority on the basis of Japanese Patent Application No. 2018-138176 filed on Jul. 24, 2018 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging device comprising:
an imaging unit including a first signal line, a first pixel, a second signal line, and a second pixel, the first pixel being configured to output a first pixel voltage to the first signal line, the first pixel voltage corresponding to an amount of received light, the second pixel being configured to output a second pixel voltage to the second signal line, the second pixel voltage corresponding to the amount of received light;
a connector including a connection line, a first connection switch, a first control circuit, a second connection switch, and a second control circuit, the first connection switch being configured to couple the first signal line to the connection line by being turned on, the first control circuit being configured to control an operation of the first connection switch based on a voltage in the first signal line, the second connection switch being configured to couple the second signal line to the connection line by being turned on, the second control circuit being configured to control an operation of the second connection switch based on a voltage in the second signal line; and
a converter that is coupled to the first signal line and the second signal line, the converter being configured to perform AD conversion based on each of the first pixel voltage and the second pixel voltage.

2. The imaging device according to claim 1, wherein
the converter is further configured to perform the AD conversion in a conversion period,
the first control circuit is further configured to turn on or off the operation of the first connection switch in a preparation period before the conversion period based on whether the voltage in the first signal line is greater than a threshold voltage, and
the second control circuit is further configured to turn on or off the operation of the second connection switch in the preparation period based on whether the voltage in the second signal line is greater than the threshold voltage.

3. The imaging device according to claim 2, wherein the threshold voltage is configured to be changed.

4. The imaging device according to claim 2, wherein
the conversion period includes a first period and a second period after the first period,
the first pixel is further configured to output a first initial voltage to the first signal line in the first period and output the first pixel voltage to the first signal line in the second period,
the second pixel is further configured to output a second initial voltage to the second signal line in the first period and output the second pixel voltage to the second signal line in the second period, and
the converter includes a first conversion circuit and a second conversion circuit, the first conversion circuit being configured to perform the AD conversion based on the first initial voltage and the first pixel voltage, the second conversion circuit being configured to perform the AD conversion based on the second initial voltage and the second pixel voltage.

5. The imaging device according to claim 4, further comprising a reference signal generator configured to generate a reference signal whose voltage changes with lapse of time in the first period and the second period, wherein
the first conversion circuit is further configured to perform the AD conversion based on a result of comparison between the first initial voltage and the first pixel voltage and the reference signal, and
the second conversion circuit is further configured to perform the AD conversion on based a result of comparison between the second initial voltage and the second pixel voltage and the reference signal.

6. The imaging device according to claim 5, wherein
the first conversion circuit includes:
- a first capacitor including a first terminal and a second terminal, the first terminal of the first capacitor being supplied with the reference signal,
- a second capacitor including a first terminal and a second terminal, the first terminal of the second capacitor being coupled to the first signal line, and
- a comparison circuit configured to compare a voltage at the second terminal of the first capacitor and a voltage at the second terminal of the second capacitor, and the first conversion circuit is further configured to set a voltage of the second capacitor in the preparation period.

7. The imaging device according to claim 6, wherein
the comparison circuit includes:
- a first transistor including a gate, a source, and a drain, the gate of the first transistor being coupled to the second terminal of the first capacitor,
- a second transistor including a gate, a source, and a drain, the gate of the second transistor being coupled to the second terminal of the second capacitor, the source of the second transistor being coupled to the source of the first transistor,
- a first switch configured to couple the gate of the first transistor and the drain of the first transistor in the preparation period, and
- a second switch configured to couple the gate of the second transistor and the drain of the second transistor in the preparation period.

8. The imaging device according to claim 1, wherein
the first signal line, the second signal line, the first pixel, and the second pixel are on a first semiconductor substrate,
the connector and the converter are on a second semiconductor substrate, and the second semiconductor substrate is on the first semiconductor substrate.

* * * * *